(12) United States Patent
Liu et al.

(10) Patent No.: US 8,779,423 B2
(45) Date of Patent: Jul. 15, 2014

(54) SEMICONDUCTOR STRUCTURES AND FABRICATION METHODS INCLUDING TRENCH FILLING

(71) Applicants: Jiquan Liu, Shanghai (CN); Shengan Xiao, Shanghai (CN); Wei Ji, Shanghai (CN)

(72) Inventors: Jiquan Liu, Shanghai (CN); Shengan Xiao, Shanghai (CN); Wei Ji, Shanghai (CN)

(73) Assignee: Shanghai Hua Hong Nec Electronics Company, Limited, Shanghai (CN)

(*) Notice: Subject to any disclaimer, the term of this patent is extended or adjusted under 35 U.S.C. 154(b) by 0 days.

(21) Appl. No.: 13/652,812

(22) Filed: Oct. 16, 2012

(65) Prior Publication Data
US 2013/0105796 A1    May 2, 2013

(30) Foreign Application Priority Data
Oct. 31, 2011  (CN) .......................... 2011 1 0337812

(51) Int. Cl.
  *H01L 29/04*    (2006.01)
(52) U.S. Cl.
  USPC ............. 257/52; 438/482; 438/478; 438/492; 438/488; 438/289

(58) Field of Classification Search
  USPC ................ 257/52, E21.102, E21.09, E29.003
  See application file for complete search history.

(56) References Cited

U.S. PATENT DOCUMENTS

| | | | |
|---|---|---|---|
| 7,364,980 B2 | 4/2008 | Nogami et al. | |
| 2011/0244664 A1* | 10/2011 | Liu et al. | 438/478 |
| 2011/0287613 A1* | 11/2011 | Liu et al. | 438/478 |

* cited by examiner

*Primary Examiner* — Chuong A Luu
*Assistant Examiner* — Rodolfo Fortich
(74) *Attorney, Agent, or Firm* — Anova Law Group, PLLC

(57) ABSTRACT

A method is provided for fabricating a semiconductor structure. The method includes providing a semiconductor substrate, forming an epitaxial layer on a top surface of the semiconductor substrate and having a predetermined thickness, and forming a plurality of trenches in the epitaxial layer. The trenches are formed in the epitaxial layer and have a predetermined depth, top width, and bottom width. Further, the method includes performing a first trench filling process to form a semiconductor layer inside of the trenches using a mixture gas containing at least silicon source gas and halogenoid gas, stopping the first trench filling process when at least one trench is not completely filled, and performing a second trench filling process, different from the first trench filling process, to fill the plurality of trenches completely.

24 Claims, 21 Drawing Sheets

Residue trench depth (μm)

Residue trench depth

SEMICONDUCTOR STRUCTURES AND FABRICATION METHODS INCLUDING TRENCH FILLING

CROSS-REFERENCES TO RELATED APPLICATIONS

This application claims the priority of Chinese patent application No. 201110337812.1, filed on Oct. 31, 2011, the entirety of which is incorporated herein by reference.

FIELD OF THE INVENTION

The present invention generally relates to the field of semiconductor manufacturing technology and, more particularly, relates to techniques for fabricating high-performance semiconductor devices utilizing silicon epitaxial growth trench filling methods.

BACKGROUND

It is well known that power semiconductor devices are the building blocks of power electronic products, which have been developed rapidly due to the intensive demands in the recent years. With the development of semiconductor technology, the size of power semiconductor devices continues to shrink; their weights become lighter; the safety and reliability of these devices are higher; and the power consumption is lower. Power semiconductor devices, also called power electronic devices, include discrete power semiconductor devices and integrated power semiconductor circuits. These devices have been widely used to convert and control current, voltage, frequency, phase and phase number to achieve functions of a rectifier (AC-to-DC), inverter (DC-to-AC), chopper (DC-to-DC), switch, and/or amplifier, etc. And they are able to tolerate high voltages and withstand high currents.

The power semiconductor devices are generally used to function as switches, because they have minimum power consumption at "ON" and "OFF" states. Therefore, power semiconductor devices constitute the heart of electronic systems. They have been widely used in the fields of communication, consumer electronics, automobile, and industry control, etc.

Power semiconductor devices can be categorized into diodes, triodes, power transistors, and thyristors according to their device structures. Power transistors are becoming dominant in power semiconductor devices because of their excellent performance. Power transistors can be classified as metal-oxide semiconductor field effect transistors (MOSFETs) and insulated gate biploar transistors (IGBTs). Power MOSFETs are provided with two types of device structures: vertical double-diffused MOSFETs (VDMOSFETs) and lateral double-diffused MOSFETs (LDMOSFETs). Because LDMOSFETs occupy larger chip areas than VDMOSFETs and cannot have a higher chip-integration level, VDMOSFETs have become the trend of power transistor research and development.

In principle, a VDMOSFET is the combination of a MOSFET and a junction gate field-effect transistor (JFET), where the N drift region is equivalent to the channel region of a JFET. Therefore, the width, doping concentration and inner defects of the N drift region can significantly affect the device performance. For example, if the resistivity of the N drifts region is high and a portion of the region underneath P region is not conductive, the on-resistance may be still high, which would affect the output power. Similarly, voltage tolerance and surface breakdown of P—N junction may also significantly affect the device performance.

Two major parameters, breakdown voltage ($V_{BD}$) and on-resistance ($R_{ON}$), must be seriously considered when designing power MOSFETs. Breakdown voltage decreases dramatically when the resistivity of depletion layer (epitaxial layer) decreases, and on-resistance depends on the resistivity of epitaxial layer. The higher doping concentration of depletion layer is, the lower on-resistance ($R_{ON}$) is, which also results in a lower breakdown voltage ($V_{BD}$). And vice versa, the lower the doping concentration is, the higher on-resistance ($R_{ON}$) is, although decreasing the carrier number in depletion layer would result in a higher breakdown voltage ($V_{BD}$). Thus, these two parameters appear contradictory, which means that if a higher breakdown voltage is needed, the on-resistance will be higher too; if a lower on-resistance is preferred, the breakdown voltage will be lower.

Thus, there is a limitation concerning the dependence of on-resistance on breakdown voltage, called "silicon limit", under which on-resistance cannot be lowered further. To break this limitation, a theory called "super junction theory" was developed, which substitutes the low-level doped drift region in conventional power MOSFETs with numerous alternatively distributed P pillars and N pillars as voltage support layers. MOSFETs designed by this theory are called super junction (SJ) MOSFETs. The P pillars in SJMOSFETS have relatively large depth-to-width ratios, which means that the depth of P pillars is larger than their width.

In an SJMOSFET, the epitaxial layer on the substrate is replaced by alternatively distributed N-type drift regions and P-type isolation regions. P-type isolation regions are placed in adjacent N-type drift regions to form P—N junctions. When the SJMOSFET is at on-state, drift current passes through the N-type drift regions. On the other hand, when an SJMOSFET is at cut-off state, depletion layer spreads from every P—N junction between N-type drift region and P-type isolation region to N-type drift region. Under this circumstance, the outermost part of the laterally spreading depletion region which passes through both sides of vertical direction of P-type isolation region speeds up the depletion, which depletes P-type isolation region simultaneously. Therefore, the breakdown voltage ($V_{BD}$) increases. In addition, the on-resistance of MOSFET can be reduced by increasing the doping level of N-type drift regions.

Although SJMOSFETs have great advantages compared to conventional MOSFETs, the fabrication process is difficult due to the difficulties for forming alternatively distributed P-type and N-type semiconductor regions. Currently, there are two major fabrication processes to form these structures. One is multi-epitaxial growth, which uses multiple times of epitaxial growth to form N-type drift regions. The other is to deposit a thick N-type epitaxial layer, followed by etching deep trenches, then to fill the trenches using P-type silicon epitaxial growth to form the SJMOSFET with alternatively distributed P—N junctions. The first method is easier than the second one, but with a higher cost. The second method is relatively difficult, especially for the trench filling process.

Existing methods mainly utilize a mixture of halogenoid gas and silicon source gas to fill trenches. However, if a silicon source gas is used alone, voids may form inside of the trenches. These voids will reduce breakdown voltage of power semiconductor devices and deteriorate device electric properties. If the mixture of two kinds of gases, halogenoid gas and silicon source gas, is used, the trench filling time may be longer. Therefore, how to ensure the trench filling effects while still retaining desired trench filling efficiency, i.e., the time to fill the trenches is not too long, is becoming a challenging technological topic in the field of design and fabrication of high-power semiconductor devices. The disclosed methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate, forming an epitaxial layer on a top surface of the semiconductor substrate and having a predetermined thickness, and forming a plurality of trenches in the epitaxial layer. The trenches are formed in the epitaxial layer and have a predetermined depth, top width, and bottom width. Further, the method includes performing a first trench filling process to form a semiconductor layer inside of the trenches using a mixture gas containing at least silicon source gas and halogenoid gas, stopping the first trench filling process when at least one trench is not completely filled, and performing a second trench filling process, different from the first trench filling process, to fill the plurality of trenches completely.

Another aspect of the present disclosure includes a semiconductor structure. The semiconductor structure includes a semiconductor substrate having a top surface, an epitaxial layer formed on the top surface of the semiconductor substrate and having a predetermined thickness, and a plurality of trenches formed in the epitaxial layer. The plurality of trenches have a predetermined depth, top width, and bottom width. Further, the semiconductor structure includes a plurality of semiconductor junctions formed based semiconductors filled in the plurality of trenches. The semiconductors are filled in the trenches by performing a first trench filling process to form a semiconductor layer inside of the trenches using a mixture gas containing at least silicon source gas and halogenoid gas, stopping the first trench filling process when at least one trench is not completely filled, and performing a second trench filling process, different from the first trench filling process, to fill the plurality of trenches completely to form the semiconductors in the trenches.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Certain terms and/or definitions are explained first. The term on-resistance ($R_{ON}$), as used herein, may refer to the resistance that exists when a semiconductor device overcomes the semiconducting characteristics to become electrically conductive, which is closely related to the doping level of the semiconductor device.

The term breakdown voltage ($V_{BD}$), as used herein, may refer to the minimum voltage that cause portion of an insulator to become electrically conductive. That is, the insulator will lost its dielectric properties and change from semiconductor to conductor at or above the minimum voltage, which is called breakdown, and the corresponding minimum voltage is called breakdown voltage.

The term reduced pressure chemical vapor deposition (RPCVD), as used herein, may refer to a deposition process to produce thin films by introducing precursor (gas/liquid) of the thin film elements or other required gases to a reaction chamber with a relatively low pressure to cause chemical reaction on the surface of the substrate to form the thin film.

The term atmospheric pressure chemical vapor deposition (ATM-CVD), as used herein, may refer to a deposition process to produce thin films by introducing precursor (gas/liquid) of the thin film elements or other required gases to a reaction chamber with an atmospheric pressure to cause chemical reaction on the surface of the substrate to form the thin film.

The term Torr, as used herein, is a unit of vacuum strength, and 1 Torr is equal to the pressure of one millimeter of mercury.

Figure 1A:
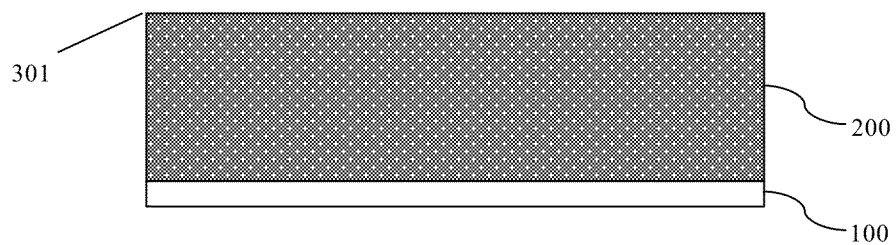
FIGS. 1A-1D illustrate semiconductor structures corresponding to certain stages of an exemplary trench filling process consistent with the disclosed embodiments.
Figure 18:
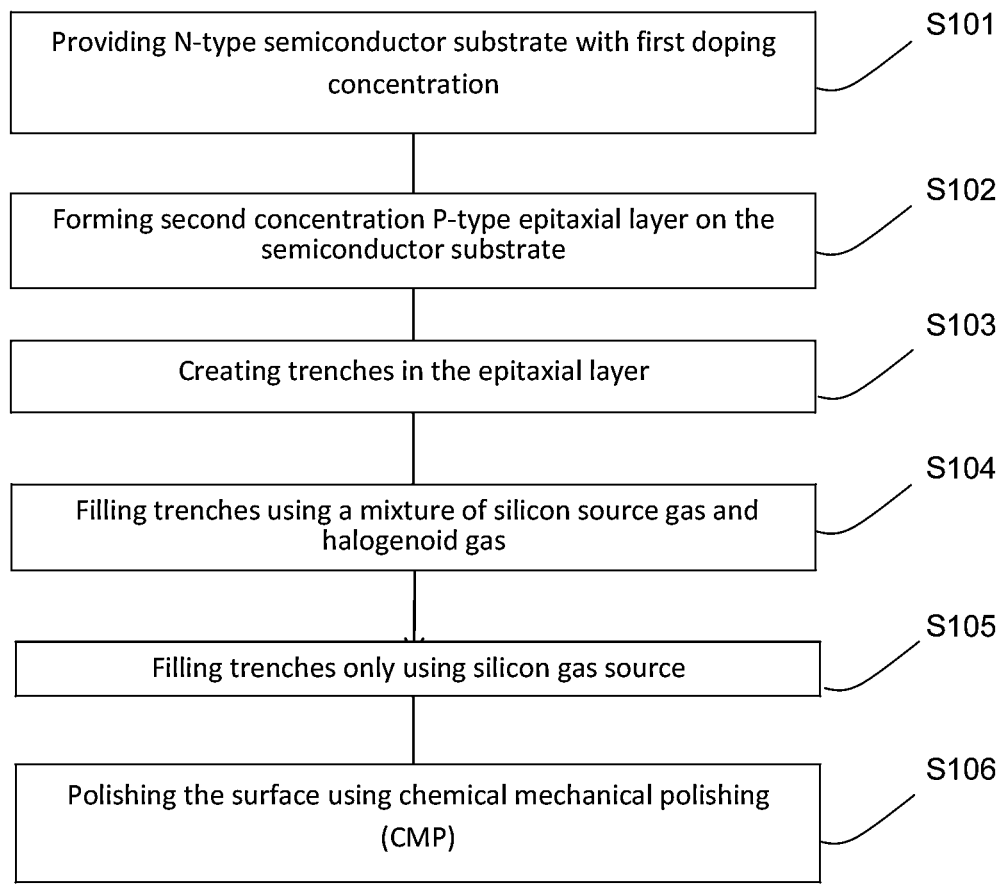
FIG. 18 illustrates an exemplary trench filling process of a semiconductor device consistent with the disclosed embodiments.

To describe the disclosed semiconductor structures and fabrication methods, FIG. 18 illustrates an exemplary trench filling process of a semiconductor device during a fabrication process. As shown in FIG. 18, at the beginning of the process, a semiconductor substrate is provided (S101). FIG. 1A illustrates a corresponding semiconductor structure.

As shown in FIG. 1A, at the beginning, a semiconductor substrate 100 is provided. The substrate 100 may have a [100] crystal orientation and may be N-type doped with a doping concentration ranging from $2E^{19}$ to $8E^{19}$ atoms/cm$^3$. The substrate 100 may include any appropriate semiconductor materials, such as silicon or silicon on insulator (SOI). In one embodiment, the N-type doping concentration is approximately $2E^{19}$ atoms/cm$^3$. Further, other type of doping, such as P-type, may also be used.

Returning to FIG. 18, after the substrate 100 is provided, an N-type epitaxial layer is formed on the semiconductor substrate 100 (S102). As shown in FIG. 1A, the N-type epitaxial layer 200 may be formed on top of the substrate 100. The N-type epitaxial layer 200 may be formed by any appropriate process, such as a chemical vapor deposition (CVD). The CVD process may use any one of $SiCl_4$, $SiHCl_3$, $SiH_4$ and $SiH_2Cl_2$ as a silicon source gas and $H_2$ as a carrier gas. The doping gas may be any one or more of Phosphine ($PH_3$) and Phosphorus trichloride ($PCl_3$). The doping concentration of the epitaxial layer ranges from $5E^{14}$ to $5E^{15}$ atoms/cm$^3$. Other methods or processes for forming epitaxial layer, such as a molecular beam epitaxy (MBE) process, and other type of doping, such as P-type, may also be used.

In one embodiment, the CVD process may use $H_2$ to carry $SiCl_4$ gas into a reaction chamber containing the substrate 100. High temperature chemical reactions may occur inside the reaction chamber to cause the silicon-based gas to deoxygenize or thermal decompose, and the resulted silicon atoms can grow epitaxially on the surface of the substrate 100 to form epitaxial layer 200. At the same time, doping gas, such as $PH_3$, etc., is introduced into the reaction chamber to form N-typed doped epitaxial layer on the surface of substrate 100. The doping concentration may be approximately $5E^{14}$ atoms/cm$^3$. The thickness of the epitaxial layer 200 may be approximately 50 um.

Figure 1B:
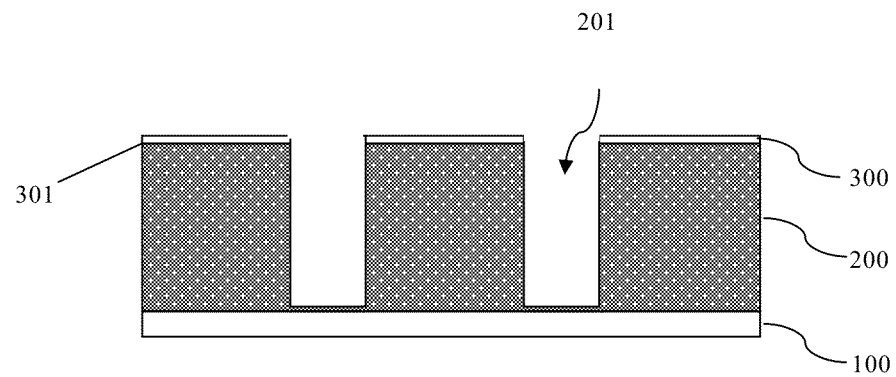

Returning to FIG. 18, after the N-type epitaxial layer 200 is formed, trenches in active region and trenches in inactive region are formed in the epitaxial layer 200 (S103). FIG. 1B illustrates a corresponding semiconductor structure.

As show in FIG. 1B, trench 201 may be formed in the epitaxial layer 200. Trench 201 may be formed by any appropriate process, such as an etching process, in both active region and inactive or passive region. The etching process may be a dry etching including ion milling and deep reactive ion etching, or a wet chemical etching. An insulation film or photoresist film may be formed on top of the epitaxial layer 200 and an etching mask 300 may be formed using the insulation film or photoresist film such that the epitaxial layer 200 may be etched to form active region trenches and inactive region trenches 201. The depth of the trench 201 may be larger than its width, and the top width may be larger than or equal to the bottom width. The crystal orientation of the sidewall of the trench 201 may be [100].

In one embodiment, an insulation film may be used to form etching mask 300, and a vapor etching process (i.e., a dry etching process) may be used to etch the epitaxial layer 200 to form trenches 201. The depth of the trench 201 may be approximately 35 um, the top width of the trench 201 may be 5 um, and the bottom width of the trench 201 may also be 5 um.

Figure 1C:
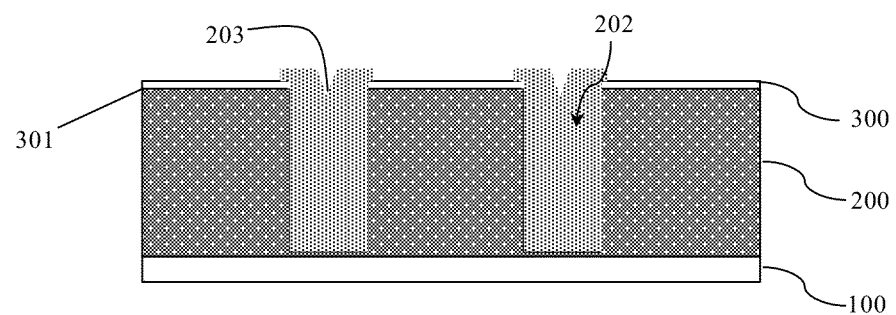

Returning to FIG. 18, after forming the trench 201 in the epitaxial layer 200, the first trench filling process may be performed, which is to use a constant flow of a mixture of a silicon source gas and a halogenoid gas to fill the trench 201 in epitaxial layer 200 (S104). FIG. 1C illustrates a corresponding semiconductor structure.

As shown in FIG. 1C, the trench 201 is filled by a mixture of a silicon source gas and a halogenoid gas. The silicon source gas may be any one or more of silane ($SiH_4$), dichloromethylsilane ($SiH_2Cl_2$), Trichlorosilane ($SiHCl_3$), and silicon tetrachloride ($SiCl_4$), etc. The halogenoid gas may be any one or more of chlorine ($Cl_2$), hydrogen chloride (HCl), fluorine ($F_2$), Chlorine trifluoride ($ClF_3$), hydrogen fluoride (HF), and hydrogen bromide (HBr). During the first trench filling process, the flow of the silicon source gas may be gradually decreased and/or the flow of the halogenoid gas may be increased, in gradient.

The trench filling process may be performing by using an RPCVD, an APCVD, or an MBE. A P-type semiconductor 202 may be formed inside trench 201 after the trench filling process. Other type of semiconductor, such as an N-type, may also be used.

When the RPCVD is used to form the P-type semiconductor, the temperature of the deposition process may range from 800° C. to 1100° C. and the pressure may be from 20 Torr to 700 Torr. When the APCVD is used to form the P-type semiconductor, the temperature may be from 900° C. to 1150° C. and the pressure is the atmospheric pressure. The doping concentration of the P-type semiconductor formed inside of the trench 201 may be from $1E^{14}$ to $1E^{17}$ atoms/cm$^3$.

In one embodiment, an RPCVD may be used as the trench filling process to form a P-type semiconductor 202 inside trench 201 in an active region, i.e., the active region trench. A mixture of $SiH_2Cl_2$, HCl and $BH_3$ as the source gas may be used in the RPCVD. The temperature of the deposition process may be approximately 800° C. and the pressure may be approximately 20 Torr. The doping concentration of the P-type semiconductor formed inside of the trench 201 may be approximately $1E^{14}$ atoms/cm$^3$. The flow rate of individual $SiH_2Cl_2$, HCl and $BH_3$ gas may be kept constant.

Further, the depth of the P-type semiconductor 202 may be monitored to control the deposition process parameters, including the deposition time. For example, when the lowest point 203 of the P-type semiconductor 202 reaches a distance of 1.0 um from the top surface of the trench 201, the first trench filling process may be stopped. The total deposition time may be approximately 92 minutes.

Figure 1D:
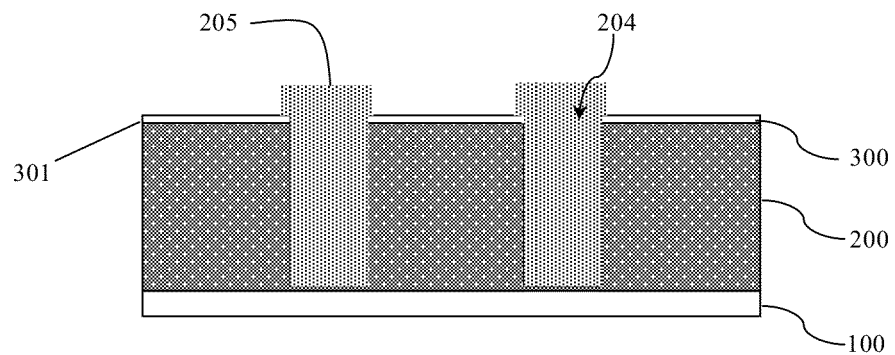

Returning to FIG. 18, after performing the first trench filling process, a final trench filling process is performed, which uses a constant flow of a silicon source gas without any halogenoid gas to fill up the remaining trench 201 (S105). FIG. 1D illustrates a corresponding semiconductor structure.

As shown in FIG. 1D, in the final or second trench filling process, the trench 201 is filled by using only silicon source gas without any halogenoid gas until the trench 201 is completely filled, i.e., the lowest point 203 reaches the top surface 301 of the trench 201. The final trench filling process may then be stopped.

In one embodiment, for active region trench 201, an RPCVD process may be used for the final trench filling with only the dichloromethylsilane ($SiH_2Cl_2$) gas without any halogenoid gas. The final trench filling process may be performed until the top of the lowest point 205 of the top surface of the P-type semiconductor 204 inside of trench 201 equals to or is higher than the top surface 301 of the trench 201. The deposition time may be approximately 0.7 minute and, thus, the total deposition time for filling the active region trench 201 (i.e., the first trenching filling process and the second or final trench filling process) may be approximately 92.7 minutes. Other deposition processes and time periods may also be used.

Figure 3:
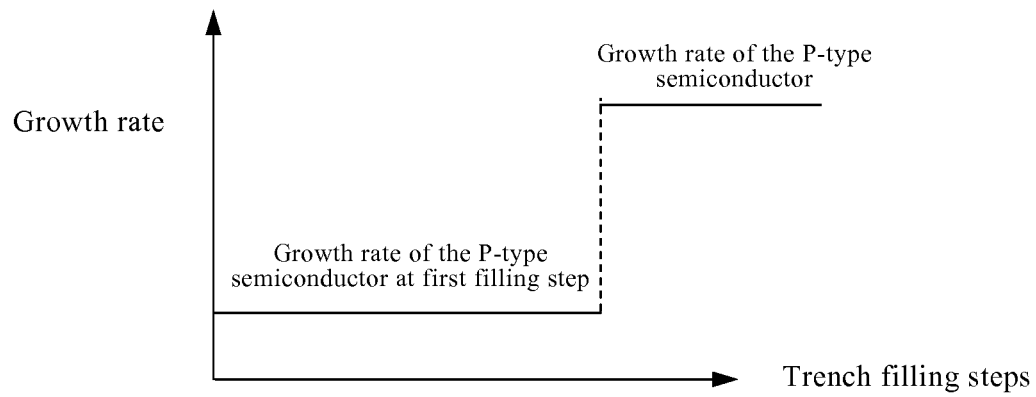
FIG. 3 illustrates a graph of the growth rate of various trench filling stages according to certain disclosed embodiment.

Further, because the second trench filling process uses only $SiH_2Cl_2$ gas and the first trench filling process uses a mixture of $SiH_2Cl_2$ gas and the HCl gas, the growth rate of the P-type semiconductor in the second trench filling process is greater than the growth rate of the P-type semiconductor in the first trench filling process. FIG. 3 illustrates different growth rates during these trenching filling process stages.

As shown in FIG. 3, the x-axis represents trench filling processes and the y-axis represents the growth rate, the growth rate of the second trench filling process is increased significantly comparing to the growth rate of the first trench filling process.

Further, between the first trench filling process and the second trench filling process, the top surface 203 of the semiconductor 202 formed inside of the trench 201 may be etched by a halogenoid gas including one or more of chlorine ($Cl_2$), hydrogen chloride (HCl), fluorine ($F_2$), chlorine trifluoride ($ClF_3$), hydrogen fluoride (HF), hydrogen bromide (HBr). Such etching may be plasma etching (PE), reactive ion etching (RIE), or ion beam etching (IBE).

Returning to FIG. 1B, after the final trench filling process, a chemical mechanical polishing process (CMP) may be performed to remove materials which are above the top surface 301 of the trench 201 in the epitaxial layer (S106). These materials include mask materials which may be silicon oxide, silicon nitride, or photoresist, and the top part of semiconductor material 205 formed by the trench filling processes. Thus, an alternating P—N "super junction" structure may be formed. Further fabrication processes may be performed to form MOSFET or IGBT devices on the super junction structure with alternatively distributed P-Ns.

That is, after the trench filling process, materials above the top surface 301 of the trench 201, which include the insulating layer and part of P-type semiconductor, are removed by the CMP process. The final super junction structures with alternatively distributed P-Ns are formed for fabricating MOSFETs or IGBTs on top of these structures.

Figure 9:
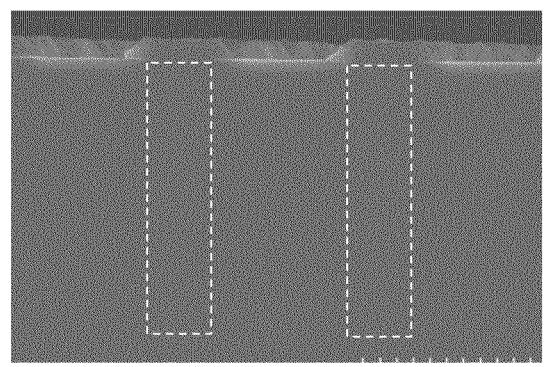
FIG. 9 is a SEM image of the cross section view of semiconductor device with filled up trenches consistent with the disclosed embodiments.

Such trench filling processes may provide desired quality in the formed semiconductor structure. The P-type semiconductor inside of trenches 201 may have no or substantially small number of void, as shown in FIG. 9 (the dotted lines showing the P-type semiconductor formed inside the trenches 201).

Figure 2A:
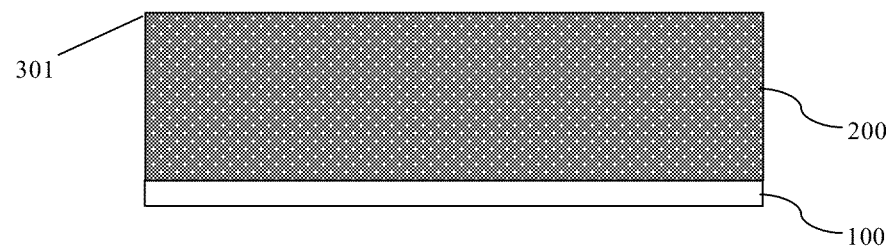
FIGS. 2A-2E illustrate semiconductor structures corresponding to certain stages of another exemplary trench filling process consistent with the disclosed embodiments.

Further, other trenching filling processes may also be used to fill trenches 201 in both the active region and the inactive region, similar to the process and structures shown in FIG. 1A-1D. For example, FIGS. 2A-2E illustrate another active region trench filling process and corresponding semiconductor structures consistent with the disclosed embodiments. At the beginning of the fabrication process, the substrate 100 is provided. FIG. 2A illustrates the corresponding semiconductor structures.

As shown in FIG. 2A, the substrate 100 may have a [100] crystal orientation and may be N-type doped with a doping concentration of approximately $4.5E^{19}$ atoms/$cm^3$. The semiconductor substrate 100 also provides a base for subsequent processes and structures.

After the substrate 100 is provided, an epitaxial layer 200 with a thickness of approximately 50 um is formed on the substrate 100 by a CVD process using $SiCl_4$ as a silicon source gas and $H_2$ as a carrier gas. The source silicon gas is introduced into the reaction chamber loaded with the substrate 100. High temperature chemical reactions may occur inside the reaction chamber to cause the silicon-based gas to deoxygenize or thermal decompose, and the resulted silicon atoms can grow epitaxially on the surface of the substrate 100 to form epitaxial layer 200. At the same time, doping gas, such as $PCl_3$, etc., is introduced into the reaction chamber to form N-typed doped epitaxial layer on the surface of substrate 100. The doping concentration may be approximately $8.5E^{14}$ atoms/$cm^3$.

Figure 2B:
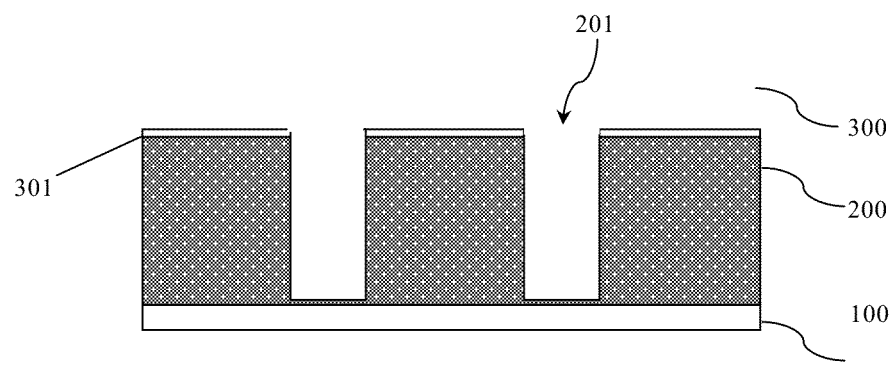

After forming the epitaxial layer 200, as shown in FIG. 2B, trench 201 with a depth of approximately 35 μm may be fabricated by a dry etching process using an insulating layer as a mask 300. The width of the top and bottom of the trench 201 are both approximately 5 μm. The crystal orientation of the sidewall of the trench 201 is [100]. The insulating layer forming the mask 100 may be silicon dioxide or silicon nitride.

Figure 2C:
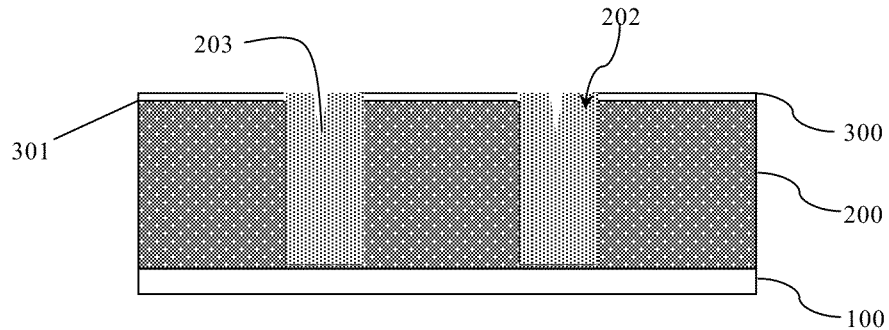

After forming the trench 201, as shown in FIG. 2C, the first trench filling process may be performed by an ATM-CVD using a mixture of $SiCl_4$, $Cl_2$ and $B_2H_6$ as the source gas. The P-type semiconductor layer 202 gradually grows inside of trench 201. The deposition temperature is approximately 900° C., the pressure is the atmospheric pressure, and the doping concentration is approximately $1.5E^{15}$ atoms/$cm^3$. The gas flow of each of $SiCl_4$, $Cl_2$ and $B_2H_6$ is maintained at a constant level.

When the distance between the lowest point 203 of the top surface of the P-type semiconductor 202 inside the trench 201 and the top surface 301 of the trench 201 in the epitaxial layer 200 is approximately 2 um, the first trench filling process is stopped. The total filling time may be approximately 90 minutes.

Figure 2D:
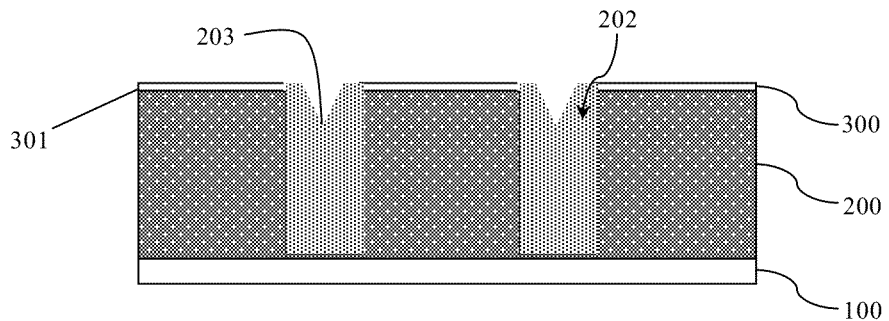

After the first trench filling process, as shown in FIG. 2D, the top of P-type semiconductor 202 inside of the trench 201 may be etched only using $Cl_2$ gas to obtain a larger opening angle of the P-type semiconductor 202. The total etching time may be approximately 0.5 minute.

Figure 2E:
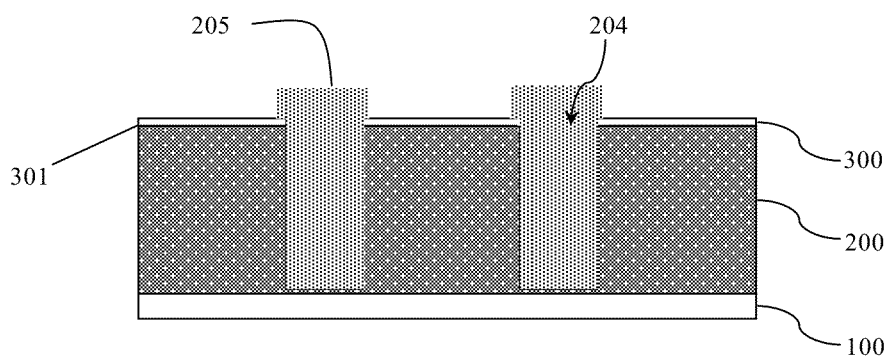

After the etching process, as shown in FIG. 2E, the remaining trench 201 continues to be filled by a second trench filling process, such as an RPCVD process using only the $SiCl_4$ gas without any halogenoid gas or $Cl_2$ gas. When the lowest point 205 of the top surface of the P-type semiconductor layer 204 is higher than the top surface 301 of the trench 201 in the epitaxial layer 200, the second trench filling process is stopped. The total filling time of the second trench filling process is approximately 1.3 minutes. The total trench filling time of the active region trenches thus is approximately 91.8 minutes.

Figure 10:
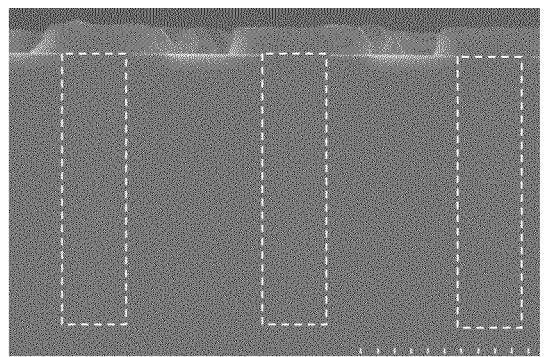
FIG. 10 is another SEM image of the cross section view of semiconductor device with filled up trenches consistent with the disclosed embodiments.

Similarly, the growth rate of the P-type semiconductor formed only using $SiCl_4$ without any halogenoid gas is greater than that of the P-type semiconductor formed using a mixture of $SiCl_4$ and $Cl_2$, as shown in FIG. 3. The P-type semiconductor inside of trenches 201 may have no or substantially small number of void, as shown in FIG. 10 (the dotted lines showing the P-type semiconductor formed inside the trenches 201.

After the second trench filling process, materials above the top surface 301 of the trench 201, which include the insulating layer and part of P-type semiconductor, are removed by a CMP process. The final super junction structures with alternatively distributed P-Ns are ready for fabricating IGBTs or other devices.

Figure 4A:
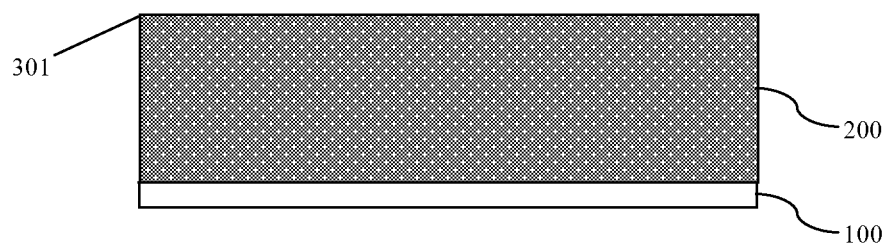
FIGS. 4A-4D illustrate semiconductor structures corresponding to certain stages of another exemplary trench filling process consistent with the disclosed embodiments.

FIGS. 4A-4D illustrate another active region trench filling process and corresponding semiconductor structures consistent with the disclosed embodiments. At the beginning of the process, as shown in FIG. 4A, the substrate 100 is provided. The substrate 100 may have a [100] crystal orientation and may be N-type doped with a doping concentration ranging from $8.0E^{19}$ atoms/$cm^3$.

After the substrate 100 is provided, an epitaxial layer 200 with a thickness of approximately 50 um is formed on the substrate 100 by a CVD process using $SiH_4$ as the silicon source gas and $H_2$ as a carrier gas. The reaction gas is introduced into the reaction chamber containing substrate 100. High temperature chemical reactions may occur inside the reaction chamber to cause the silicon-based gas to deoxygenize or thermal decompose, and the resulted silicon atoms can grow epitaxially on the surface of the substrate 100 to form epitaxial layer 200. At the same time, doping gas, such as $PH_3$, etc., is introduced into the reaction chamber to form N-typed doped epitaxial layer on the surface of substrate 100. The doping concentration may be approximately $5E^{14}$ atoms/$cm^3$.

Figure 4B:
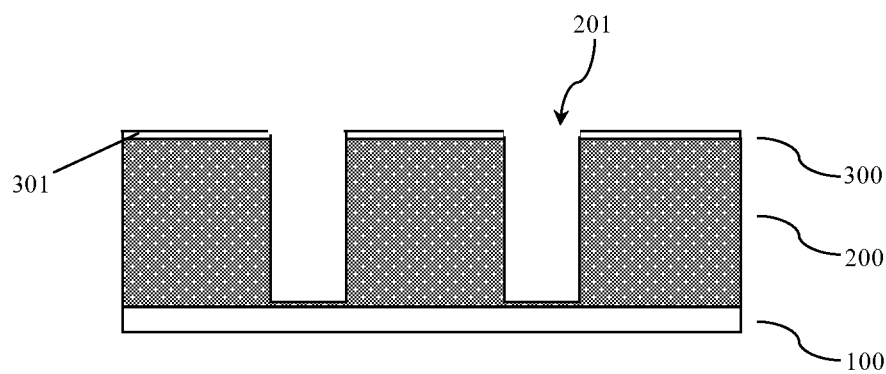

After forming the epitaxial layer 200, as shown in FIG. 4B, trenches 201 with a depth of 35 μm are fabricated by a dry etching process using a photoresist film as a mask 300. The top width and the bottom width of the trench 201 may be both 5 μm. The crystal orientation of the sidewall of the trench 201 is [100].

Figure 4C:
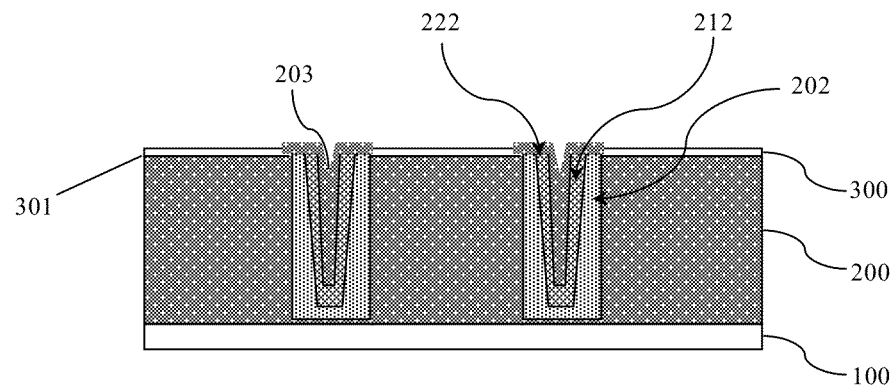

After forming the trench 201, as shown in FIG. 4C, the first trench filling process is performed by an RPCVD process using a mixture of $SiH_4$, HCl and $BCl_3$. A P-type semiconductor layer 202 gradually grows inside of trench 201.

When the first trench filling process is started, the openings of the trenches 201 are relatively large, and the growth rate may be relatively high. However, after a certain amount of time passed, the growth rate may be reduced to prevent the P-type semiconductor from growing too fast inside of the active region trench 201. The growth rate may be reduced again after another certain time period. The growth rate of the P-type semiconductor inside of the trench 201 can be controlled by decreasing in gradient the flow of $SiH_4$ and/or increasing the flow of HCl.

Figure 6A:
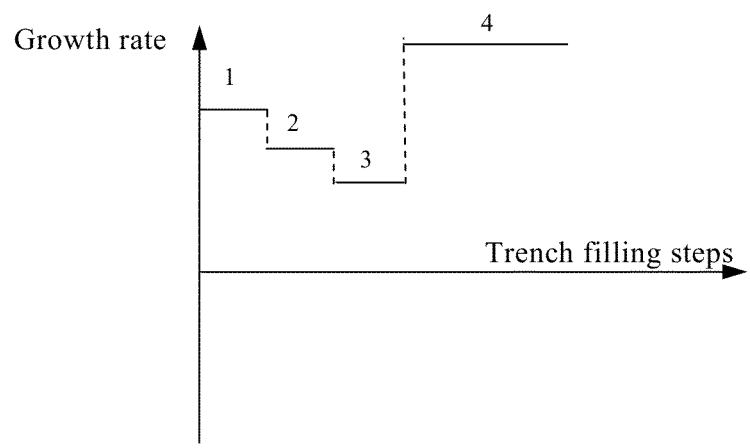
FIG. 6A illustrates a graph of the growth rate of various trench filling stages according to certain disclosed embodiment.

For example, the growth rate of the P-type semiconductor inside of the trench may be reduced twice as shown in FIG. 6A, where 1, 2, and 3 represent the various reduced growth rates during the first trench filling process. And the semiconductor grown by these steps are 202, 212 and 222, respectively, as shown in FIG. 4C. The temperature for growing the P-type semiconductor is approximately 1100° C.; the pressure is approximately 700 Torr, and the doping concentration is approximately $8.0E^{16}$ atoms/$cm^3$.

When the distance between the lowest point 203 of the top surface of the P-type semiconductor 222 and the top surface 301 of the trench 201 in the epitaxial layer 200 is approximately 4 um, the first trench filling process is stopped. The total filling time may be approximately 87 minutes.

Figure 4D:
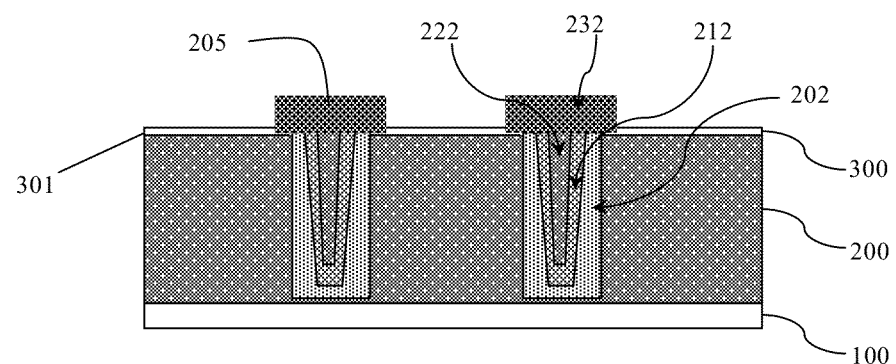

Further, as shown in FIG. 4D, the remaining trench 201 continues to be filled by an RPCVD process (i.e., the second trench filling process) using only $SiH_4$ without any halogenoid gas to form the P-type semiconductor 232. When the lowest point 205 of the top surface of the P-type semiconductor layer 232 is higher than the top surface 301 of the trench 201 in the epitaxial layer 200, this second trench filling process is stopped. The second trench filling process time may be approximately 2 minutes. Thus, the total trench filling time of the active region trenches may be approximately 89 minutes.

The growth rate in the second trench filling process may be higher than those of the first trench filling process, as shown in FIG. 6A. The line marked as 4 is the growth rate of the final trench filling process which only uses $SiH_4$, higher than growth rate 1, 2, and 3 of the first trench filling process using a mixture of $SiH_4$ and HCl.

After the trench filling processes, materials above the top surface 301 of trench 201 are removed by a CMP process. The formed super junction structures with alternatively distributed P-Ns are ready for fabricating MOSFETs or other devices.

Figure 11:
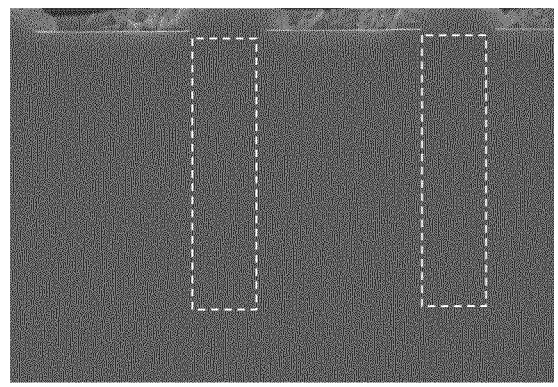
FIG. 11 is another SEM image of the cross section view of semiconductor device with filled up trenches consistent with the disclosed embodiments.

Similarly, desired quality in the P-type semiconductor inside of trenches 201 may be obtained. As shown in FIG. 11, represented as the dotted area, the P-type semiconductor has no void.

FIGS. 5A-5E illustrate another active region trench filling process and corresponding semiconductor structures consistent with the fourth disclosed embodiment. At the beginning, the substrate 100 is provided. The substrate 100 may have a [100] crystal orientation and may be N-type doped with a doping concentration ranging from $6.5E^{19}$ atoms/$cm^3$.

An epitaxial layer 200 with a thickness of approximately 50 um is formed on the substrate 100 by a CVD process using $SiCl_4$ as a silicon source gas and $H_2$ as a carrier gas. The mixture of the gases is introduced into the reaction chamber loaded with the substrate 100. High temperature chemical reactions may occur inside the reaction chamber to cause the silicon-based gas to deoxygenize or thermal decompose, and the resulted silicon atoms can grow epitaxially on the surface of the substrate 100 to form epitaxial layer 200. At the same time, doping gas, such as $PCl_3$, etc., is introduced into the reaction chamber to form N-typed doped epitaxial layer on the surface of substrate 100. The doping concentration may be approximately $8.5E^{14}$ atoms/$cm^3$.

Figure 5A:
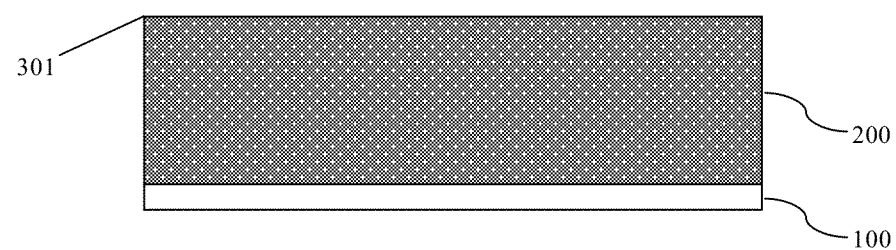
FIGS. 5A-5E illustrate semiconductor structures corresponding to certain stages of another exemplary trench filling process consistent with the disclosed embodiments.
Figure 5B:
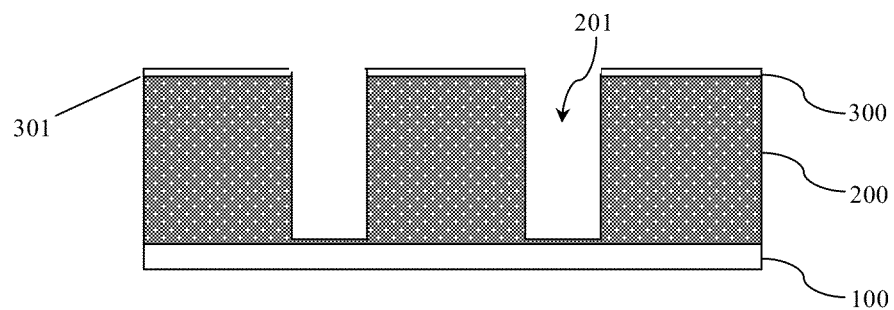
Figure 5C:
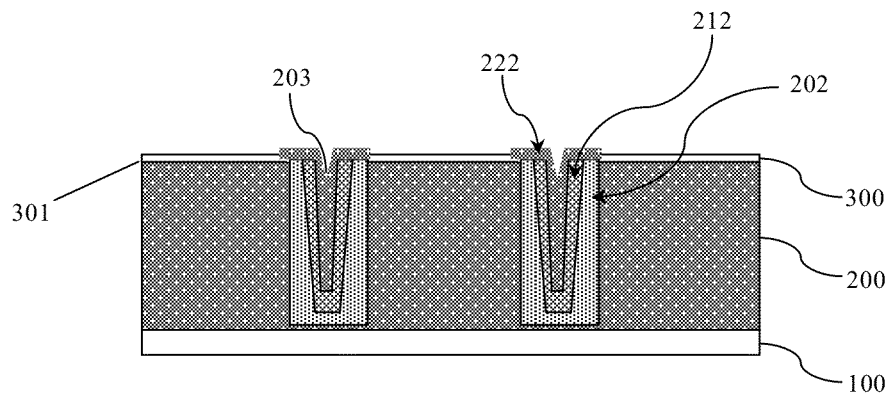

After forming the epitaxial layer 200, as shown in FIG. 5B, the trenches 201 may be formed and, as shown in FIG. 5C, an ATM-CVD process (i.e., the first trench filling process) may be performed to fill the trenches 201 using a mixture of $SiH_4$, HCl and $BCl_3$ gases. The P-type semiconductor layer 202 gradually grows inside of the trenches 201.

Figure 6B:
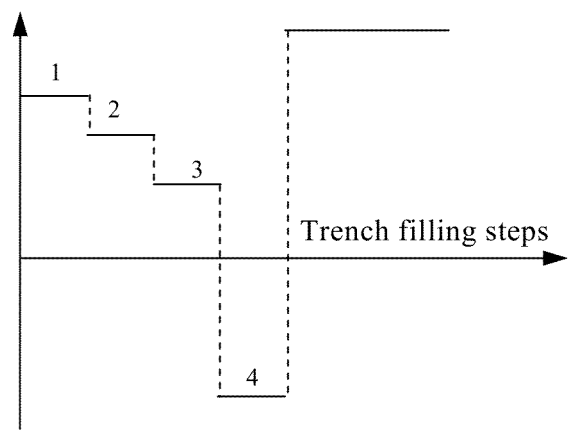
FIG. 6B illustrates a graph of the growth rate of various trench filling stages according to certain disclosed embodiment.

As shown in FIG. 5C, since the open area of the trench is pretty big, a higher growth rate can be used at first. But the growth rate should be reduced after a period of time in case the P-type semiconductor inside of the trench in the active region grows too fast. The grate rate should be reduced again later. The growth rate of the P-type semiconductor inside of trench can be controlled by either decreasing the flow of $SiH_4$ or increasing the flow of HCl. The growth rate of the P-type semiconductor inside of the trench is reduced twice as shown in FIG. 6B and the semiconductor grown by these steps are 202, 212 and 222, respectively. The temperature for growing the P-type semiconductor is 950° C.; the pressure is 200 Torr, and the doping concentration is 1.0E17 atoms/$cm^3$.

When the distance between the lowest point 203 of the top surface of the P-type semiconductor 222 and the top surface 301 of trench 201 in the epitaxial layer 200 is approximately 6 um, the first trench filling process is stopped. The first trench filling time is approximately 79 minutes.

Figure 5D:
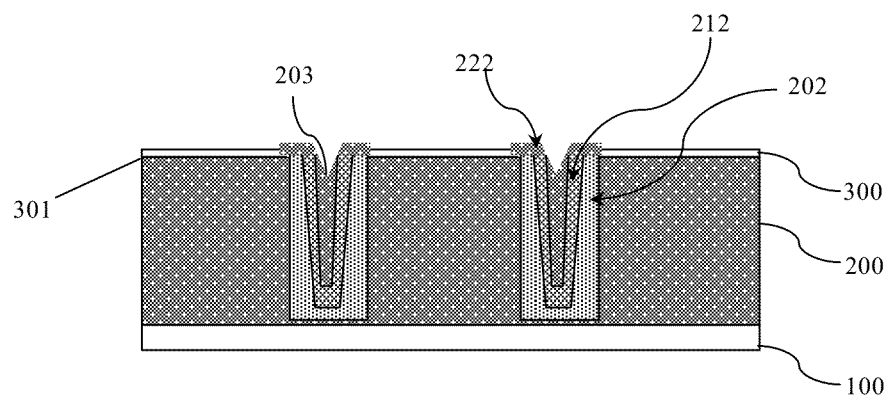

After the first trench filling process, the top of the P-type semiconductor 202 inside of the trench 201 is etched only using HCl to obtain a larger opening angle of the P-type semiconductor 202, as shown in FIG. 5D. The total etching time is approximately 0.5 minute.

Figure 5E:
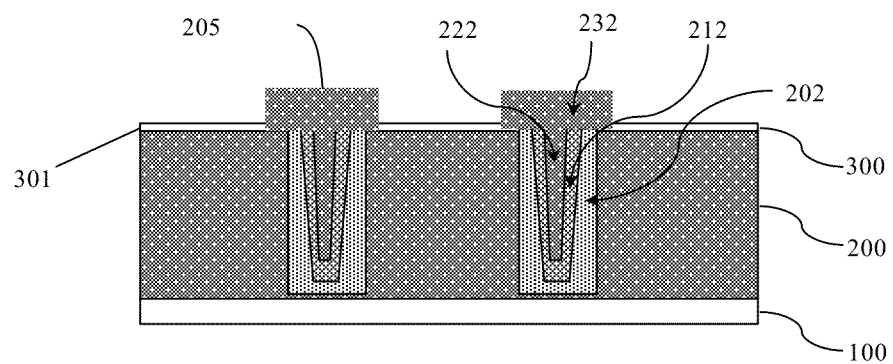

After the etching process, the remaining space of the trenches 201 continues to be filled with a P-type semiconductor by an RPCVD process (i.e., the second trench filling process) using only $SiH_4$ without any halogenoid gas. When the lowest point 205 of the top surface of the P-type semiconductor layer 232 is higher than the top surface 301 of the trench 201 in the epitaxial layer 200, the second trench filling process is stopped, as shown in FIG. 5E. The second trench filling time is approximately 5 minutes. The total trench filling time of the active region thus is approximately 84.5 minutes. The growth rate of the P-type semiconductor inside of the trench formed only using $SiH_4$ without any halogenoid gas in the final filling process is faster than that of P-type semiconductor formed using a mixture of $SiH_4$ and HCl at the first filling step. As shown in FIG. 6B, 1, 2 and 3 are the growth rates of the P-type semiconductor inside of the trench 201 during the first trench filling process; 4 is etching rate of the top of the P-type semiconductor; and 5 is the growth rate using only $SiH_4$ in the final trench filling process. Thus, growth rate 5 is larger than any one of the growth rates 1, 2 and 3.

Figure 12:
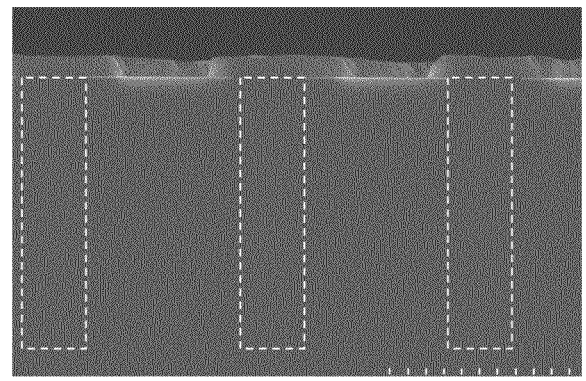
FIG. 12 is another SEM image of the cross section view of semiconductor device with filled up trenches consistent with the disclosed embodiments.

After the trench filling process, materials above the top surface 301 of trench 201 are removed by a CMP process. The final super junction structures with alternatively distributed P-Ns are ready for fabricating MOSFETs or other devices. A desired quality of trench filling process may be achieved, as shown in FIG. 12, the P-type semiconductors inside of trenches 201, as represented by the dashed areas, has no void.

Figure 7A:
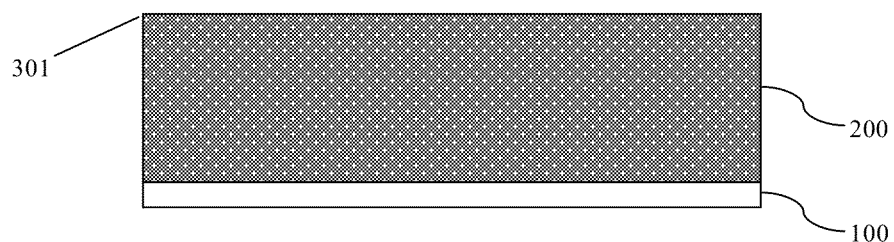
FIGS. 7A-7D illustrate semiconductor structures corresponding to certain stages of another exemplary trench filling process consistent with the disclosed embodiments.

FIGS. 7A-7D illustrate another trench filling process for filling trenches in isolated active regions and inactive regions and corresponding semiconductor structures to certain stages of the trench filling process. As shown in FIG. 7A, at the beginning, the substrate 100 is provided. The substrate 100 may have a [100] crystal orientation and may be N-type doped with a doping concentration of approximately $5.2E^{19}$ atoms/cm³. Further, an epitaxial layer 200 with a thickness of approximately 50 um is formed on the substrate 100 by a CVD process using $SiCl_4$ as a silicon source gas and $H_2$ as a carrier gas.

The mixture of the gases is introduced into the reaction chamber loaded with the substrate 100. High temperature chemical reactions may occur inside the reaction chamber to cause the silicon-based gas to deoxygenize or thermal decompose, and the resulted silicon atoms can grow epitaxially on the surface of the substrate 100 to form epitaxial layer 200. At the same time, doping gas, such as $PH_3$, etc., is introduced into the reaction chamber to form N-typed doped epitaxial layer on the surface of substrate 100. The doping concentration may be approximately $2.4E^{15}$ atoms/cm³.

Figure 7B:
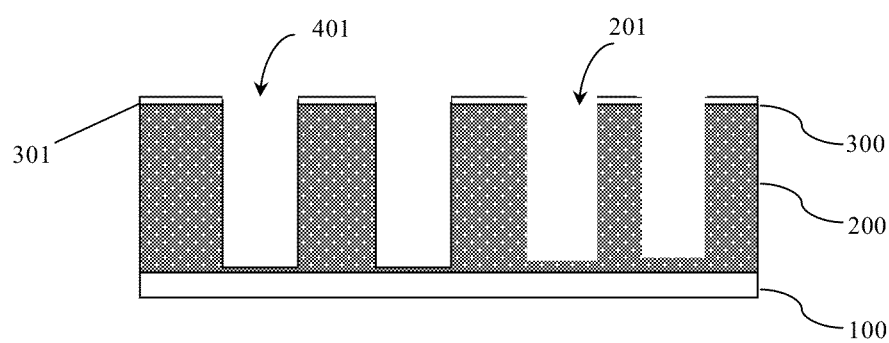

As shown in FIG. 7B, after forming the epitaxial layer 200, the active region trench 201 and the trench 401 in the non-active or passive region may be formed by a dry etching process using the insulating layer as a mask 300. The depth of the active region trench 201 and the trench 401 in the non-active or region may be approximately 35 µm, the top and bottom width of the active region trench 201 are both approximately 5 µm, and the top and bottom width of the inactive region trench 401 are both approximately 6 µm. The crystal orientation of the sidewall of the trenches is [100]. The trench 201 in active region and the trench 401 in passive region are isolated.

After forming the trench 201 in active region and the trench 401 in passive region, the first trench filling process is performed by an RPCVD process using a mixture of $SiH_2Cl_2$, HCl and $B_2H_6$. Both trench in the active region and trench in the passive region are filled simultaneously to gradually form an active region P-type semiconductor 202 and a passive region P-type semiconductor 402 in the trench 201 and the trench 401, respectively. The temperature for growing P-type semiconductors is approximately 950° C.; the pressure is approximately 500 Torr; and the doping concentration is approximately $5.0E^{16}$ atoms/cm³. The gas flow of each of $SiH_2Cl_2$, HCl and $B_2H_6$ is maintained at a constant level.

Figure 7C:
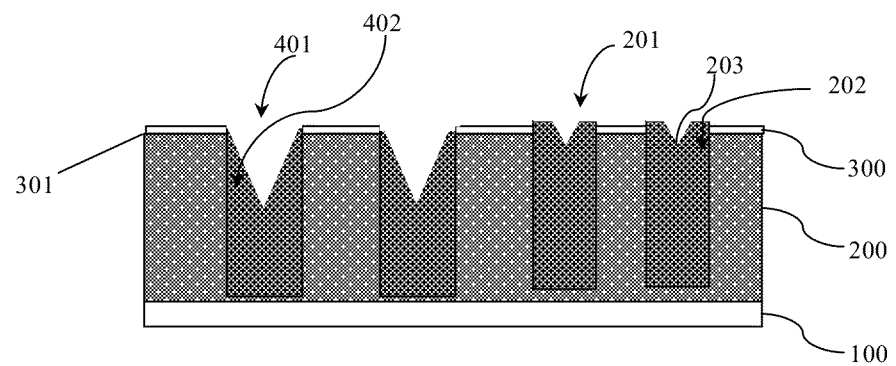

As shown in FIG. 7C, when the distance between the lowest point 203 of the top surface of the P-type semiconductor 202 in the active region trench 201 and the top surface 301 of the trench 201 in the epitaxial layer 200 is approximately 1 um, the first trench filling process is stopped. The total filling time is approximately 92 minutes.

Figure 7D:
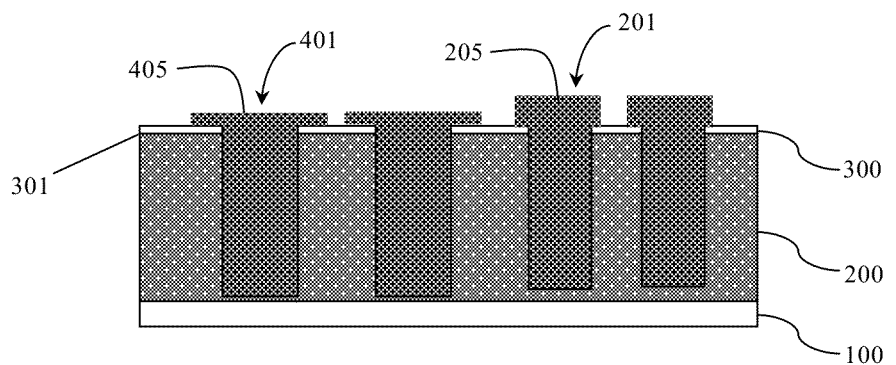
Figure 7E:
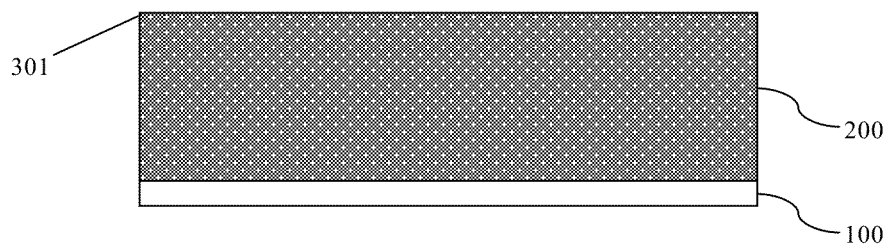
FIGS. 7E-7I illustrate semiconductor structures corresponding to certain stages of another exemplary trench filling process consistent with the disclosed embodiments.
Figure 7F:
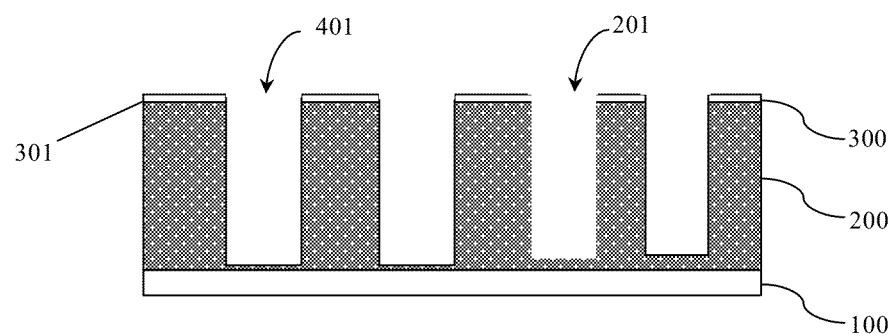
Figure 7G:
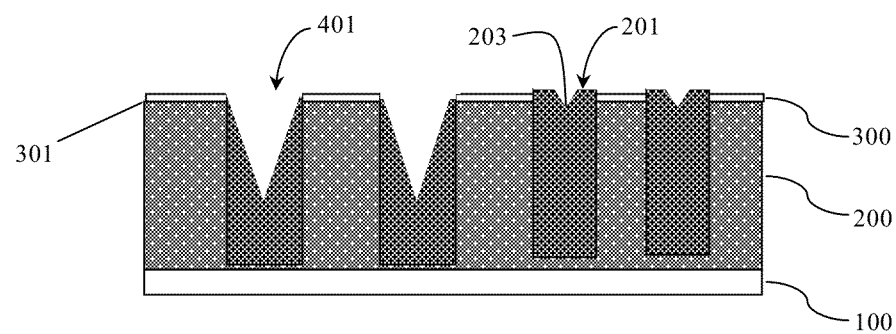

Further, the second trench filling process is performed by an RPCVD process to fill the remaining of the trench 201 and the trench 401 using only $SiH_2Cl_2$ without any halogenoid gas until the lowest point 205 of the top surface of P-type semiconductor inside the active region trench 201 is higher than the top surface 301 of the trench 201 and the lowest point 405 of the top surface of the P-type semiconductor inside the passive region trench 401 is higher than the top surface 301 of the trench 401, as shown in FIG. 7D. The total filling time of this process is approximately 0.7 minutes. Thus, the total trench filling time of the active region and the passive region is approximately 92.7 minutes.

The growth rate of the P-type semiconductor inside of the trenches formed only using $SiH_2Cl_2$ without any halogenoid gas during the second or final filling process is faster than that of the P-type semiconductor formed using a mixture of $SiH_2Cl_2$ and HCl during the first trench filling process, as shown in FIG. 3.

After the trench filling processes, materials above the top surface 301 of trench 201, which include the insulating layer and portion of P-type semiconductor, are removed by a CMP process. The final super junction structures with alternatively distributed P-Ns are ready for fabricating MOSFET devices or other devices.

FIGS. 7E-7I illustrate another trench filling process for filling trenches in isolated active regions and inactive regions and corresponding semiconductor structures to certain stages of the trench filling process. The trench filling process shown in FIGS. 7E-7I is similar to the process shown in FIGS. 7A-7D.

Figure 7H:
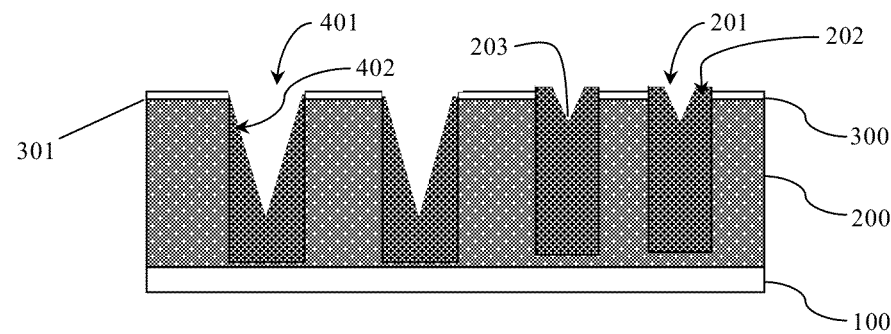

However, certain differences include, after the first trench filling process is performed on the active region trench 201 and inactive region trench 401, etching the top of the P-type semiconductor 202 inside of the active region trench 201 and the P-type semiconductor 402 inside of the inactive trench 401 to obtain larger opening angles of the P-type semiconductors inside of the trenches using HF gas, as shown in FIG. 7H.

Figure 7I:
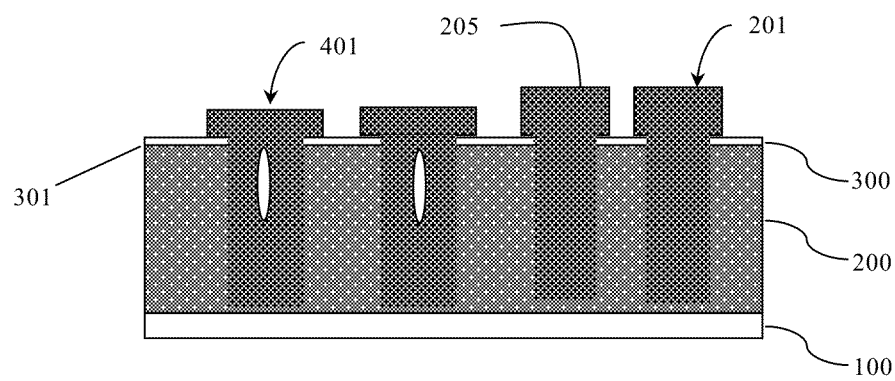
Figure 7J:
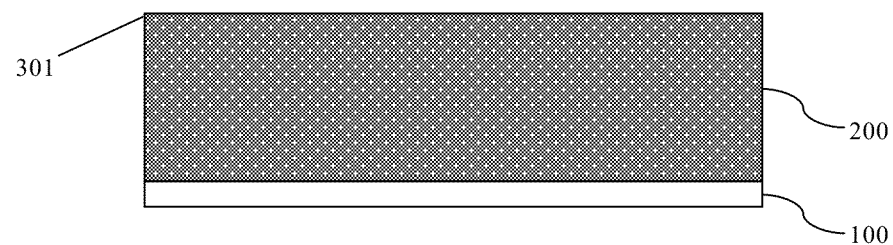
FIGS. 7J-7M illustrate semiconductor structures corresponding to certain stages of another exemplary trench filling process consistent with the disclosed embodiments.
Figure 7K:
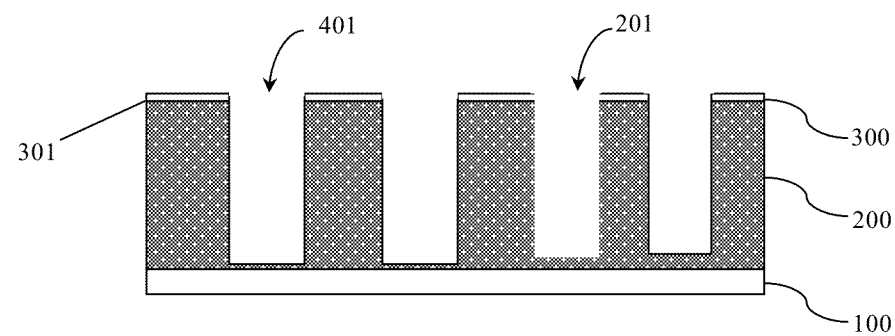

After the etching process, the second trench filling process is performed by an RPCVD process to fill the remaining of the trench 201 and the trench 401 using only $SiH_2Cl_2$ without HCl until the lowest point 205 of the top surface of P-type semiconductor 202 inside the active region trench 201 is higher than the top surface 301 of the trench 201, as shown in FIG. 7I.

FIGS. 7J-7M illustrate another trench filling process for filling trenches in isolated active regions and inactive regions and corresponding semiconductor structures to certain stages of the trench filling process. The trench filling process shown in FIGS. 7J-7M is similar to the process shown in FIGS. 7A-7D.

Figure 7L:
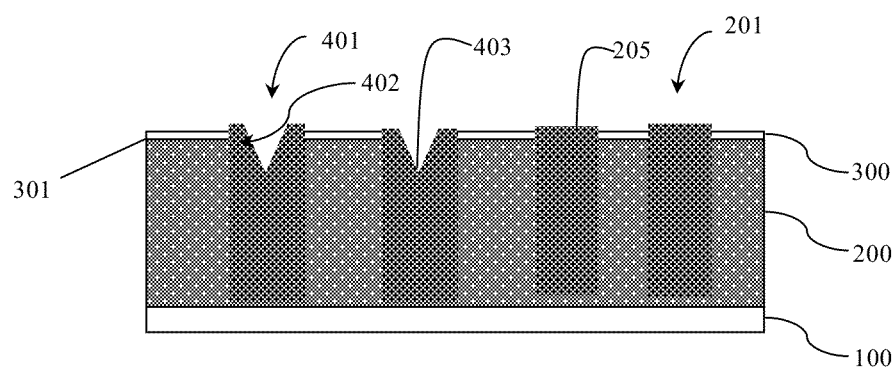

However, there are certain differences including that, after the first trench filling process is performed on the active region trench 201 and inactive region trench 401, the top surface 205 of the P-type semiconductor inside the active region trench 201 is higher than the top surface 301 of the trench 201, and the top surface 403 of the P-type semiconductor inside of the inactive region trench 401 is lower than the top surface 301 of the trench 401, as shown in FIG. 7L. That is, the active region trench 201 is filled up but the inactive region trench 401 is not filled.

Further, the first trench filling process is performed by an ATM-CVD process instead of an RPCVD process using a mixture of $SiH_2Cl_2$, HCl and $B_2H_6$. The temperature for growing P-type semiconductor is 1150° C., the pressure is the atmospheric pressure, and the doping concentration is approximately $5.9E^{16}$ atoms/cm$^3$.

Figure 7M:
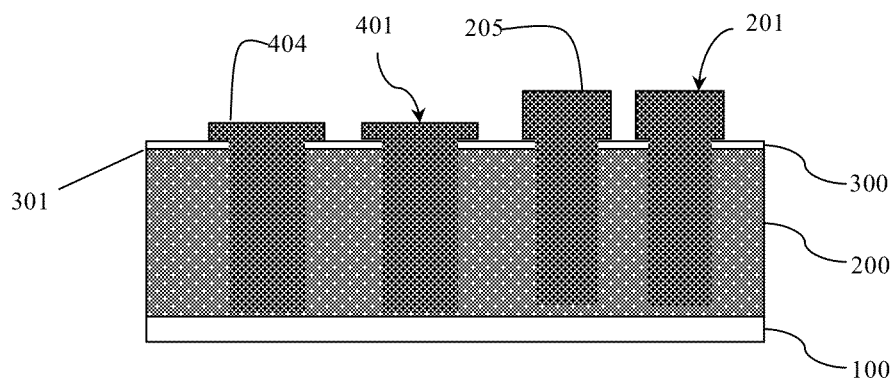

The second trenching filling process is performed to continue to fill the passive region trench 401 by an ATM-CVD process using only $SiH_2Cl_2$ without HCl, until the lowest point 404 of the top surface of the P-type semiconductor inside the trench 401 is higher than the top surface 301 of the trench 401 in the epitaxial layer 200, as shown in FIG. 7M.

Figure 19:
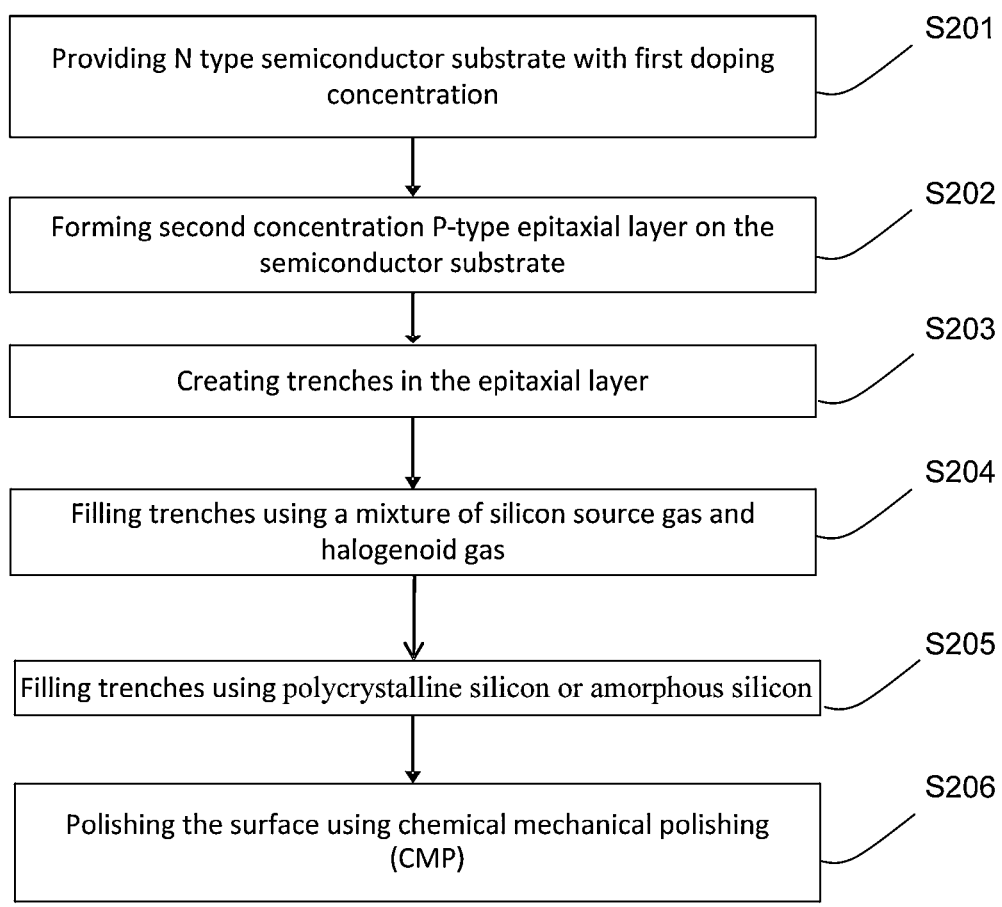
FIG. 19 illustrates another exemplary trench filling process of a semiconductor device consistent with the disclosed embodiments.

FIG. 19 illustrates another trench filling process for filling trenches in isolated active regions and inactive regions and FIGS. 7N-7R illustrate corresponding semiconductor structures to certain stages of the trench filling process.

Figure 7N:
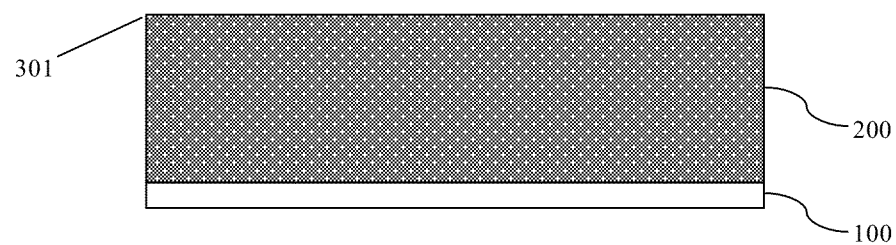
FIGS. 7N-7R illustrate semiconductor structures corresponding to certain stages of another exemplary trench filling process consistent with the disclosed embodiments.
Figure 7O:
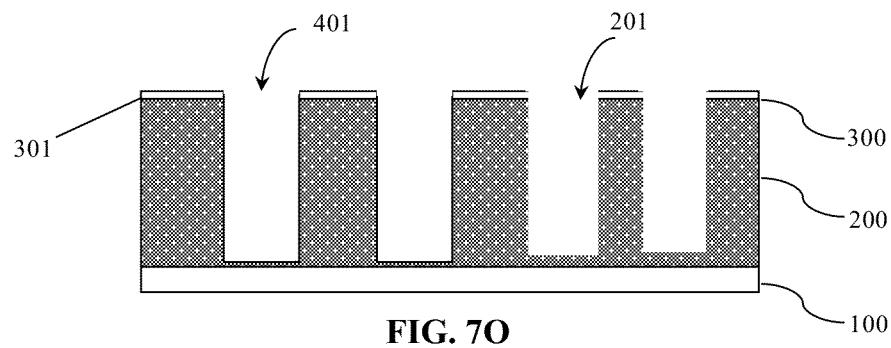
Figure 7P:
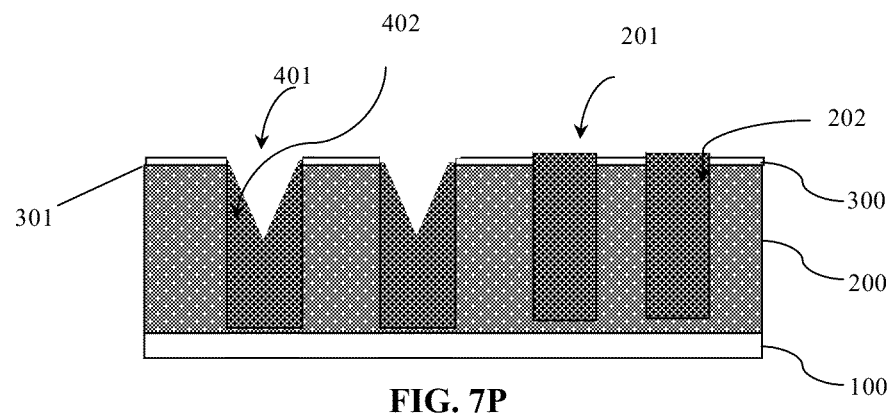

As shown in FIGS. 19, S201, S202, S203, and S204 of the trench filling process are similar to S101, S102, S103, and S104 shown in FIG. 18. FIGS. 7N-7P are similar to Figures the process shown in FIGS. 7J-7L. After the first trench filling process is performed on the active region trench 201 and inactive region trench 401, the active region trench 201 is filled while the inactive region trench 401 is not completely filled, the first trench filling process is stopped. The total filling time is approximately 92 minutes.

Figure 7Q:
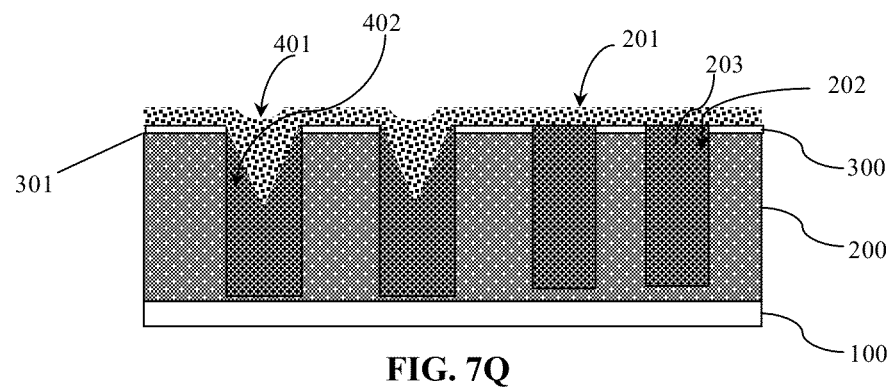

Further, however, in S205, the second trench filling process may use a different material(s), such as polycrystalline silicon or amorphous silicon, to fill the remaining spaces in the inactive region trench 401. More particularly, as shown in FIG. 7Q, using $H_2$ or $N_2$ as a carrier gas and at least one of SiH4, DCS, and TCS as a precursor, a deposition process may be performed at approximately 400-1200° C. The polycrystalline silicon or amorphous silicon is then deposited on top of the substrate 300 with a certain thickness, until the passive area trenches 401 are completely filled (i.e., all trenches are completely filled). The second trench filling process may take 180 minutes. However, because the polycrystalline silicon or amorphous silicon can be processed in batches, e.g., a total of 150 substrates in a batch, each substrate may only take approximately 1.2 minutes. Thus, the total trench filling time of the active region and the passive region is approximately 93.2 minutes.

Figure 7R:
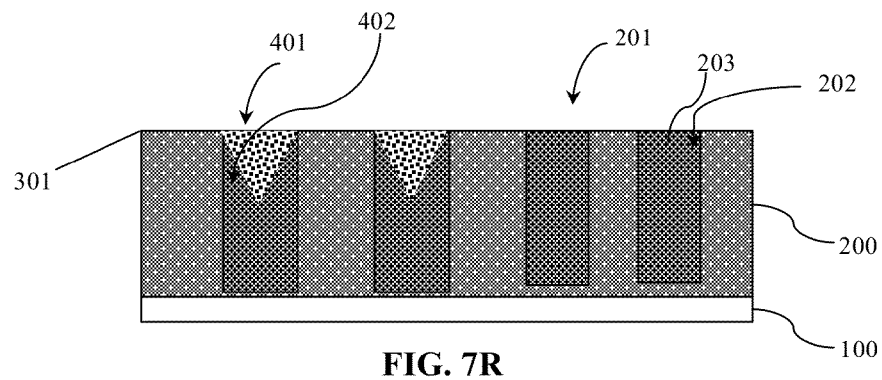

Further, in S206, materials above the top surface 301 of substrate 300, which include the insulating layer and portion of P-type semiconductor, are removed by a CMP process, as shown in FIG. 7R. The final super junction structures with alternatively distributed P-Ns are ready for fabricating MOSFET devices or other devices.

Figure 8A:
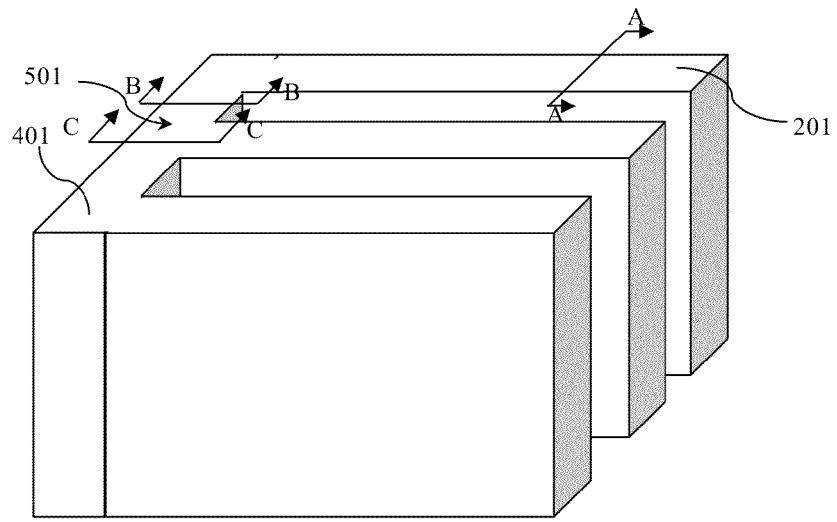
FIGS. 8A-8C illustrate semiconductor structures corresponding to certain stages of another exemplary trench filling process consistent with the disclosed embodiments.
Figure 8B:
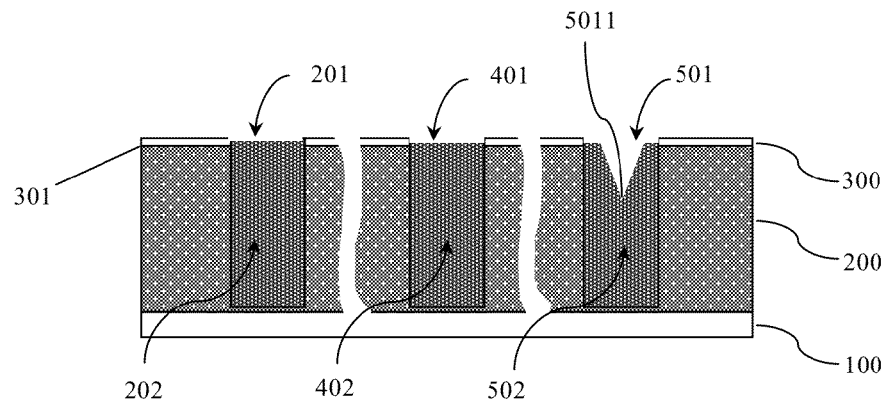
Figure 8C:
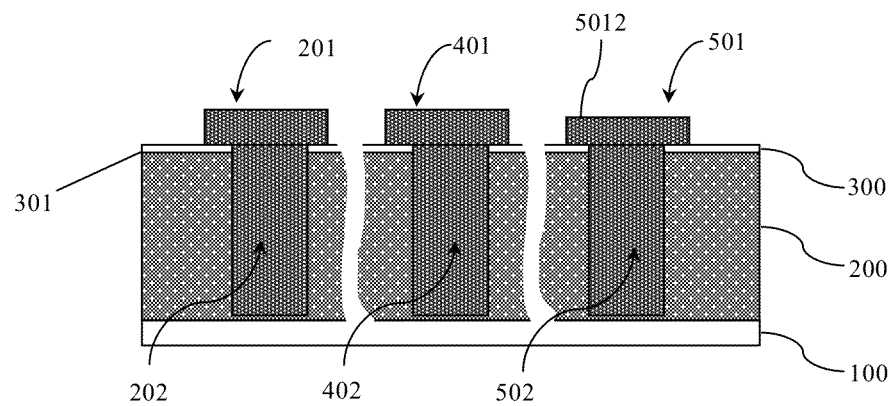

FIGS. 8A-8C illustrate another trench filling process for filling trenches in interconnected active regions and inactive regions and corresponding semiconductor structures to certain stages of the trench filling process consistent with the disclosed embodiments. As shown in FIG. 8A, the active region trench 201 and the inactive region trench 401 are interconnected (a three-dimensional interconnection). The crystal orientation of the substrate is [100], and the crystal orientation of the sidewall of the trenches is [100]. The doping concentration of the substrate is approximately $6.4E^{19}$ atoms/cm$^3$, and the doping concentration of the epitaxial layer is approximately $8.5E^{14}$ atoms/cm$^3$.

As shown in FIGS. 8B and 8C, the left side is the A-A cross-section view of FIG. 8A for the trench filling process of the active region trench 201, the middle portion is the B-B cross-section view of FIG. 8A for the trench filling process of the inactive region trench 401, and the right side is the C-C cross-section view of FIG. 8A for the trench filling process of the interconnection 501 between the active region trench 201 and inactive region trench 401.

Differences between the trench filling process shown in FIGS. 8A-8C and the process shown in FIGS. 7A-7D include that the active region trench 201 and the inactive region trench 401 are interconnected, and the depth and the width of the active region trench 201 and the depth and the width of the inactive region trench 401 are the same.

During the process, the first trench filling process is first performed by an RPCVD process using a mixture of $SiH_2Cl_2$, HCl, and $B_2H_6$ gases. A P-type semiconductor 202 is grown inside of the active region trench 201 gradually, and the P-type semiconductor 402 is grown inside of the inactive region trench 401 gradually. Both the active region trench 201 and the inactive region trench 401 may be completely filled, as shown in FIG. 8B. That is, the top surface of the P-type semiconductors inside the active region trench and the inactive region trench are at approximate same level as the top surface 301 of the trench 201 in the epitaxial layer 200, while the lowest point 5011 of the P-type semiconductor inside of the interconnection trench 501 is lower than the top surface 301 of the trench 201 in the epitaxial layer 200. P-type semiconductor may be grown at the temperature of approximately 900° C. and the pressure of approximately 300 Torr, and the doping concentration is approximately $6.0E^{16}$ atoms/cm$^3$.

Further, as shown FIG. 8C, after the first trench filling process, the interconnection trench 501 is continued to be filled by an ATM-CVD process (i.e., the second trench filling process) using only $SiH_2Cl_2$ gas without HCl gas, until the lowest point 5012 of the top surface of the P-type semiconductor inside the interconnection trench 501 is higher than the top surface 301.

After the trench filling process, materials above the top surface 301 of trenches, which include the insulating layer and a portion of the P-type semiconductor, are removed by a CMP process. The final super junction structures with alternatively distributed P-Ns are ready for fabricating MOSFET devices or other devices.

Figure 8D:
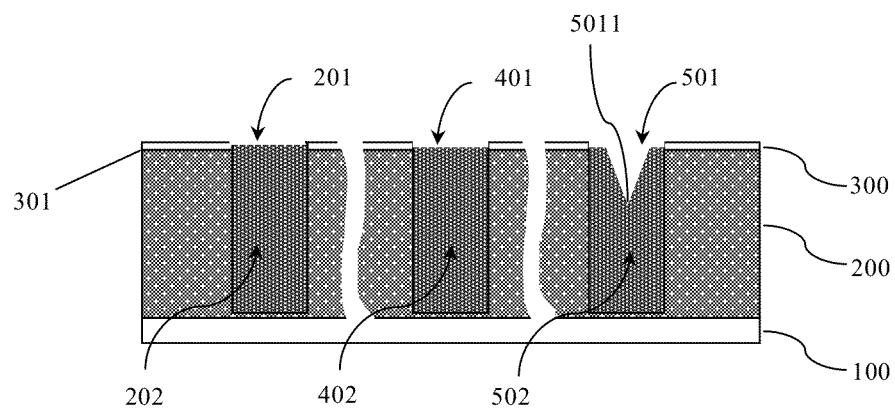
FIGS. 8D-8F illustrate semiconductor structures corresponding to certain stages of another exemplary trench filling process consistent with the disclosed embodiments.
Figure 8E:
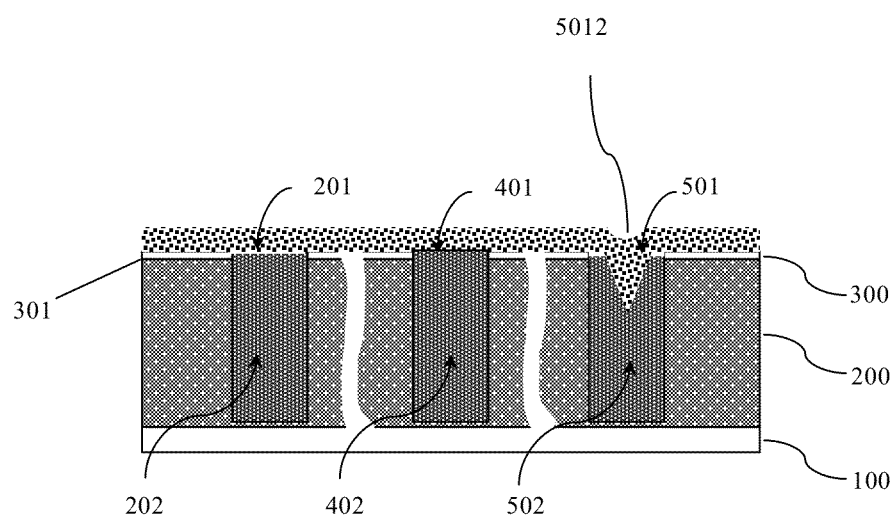
Figure 8F:
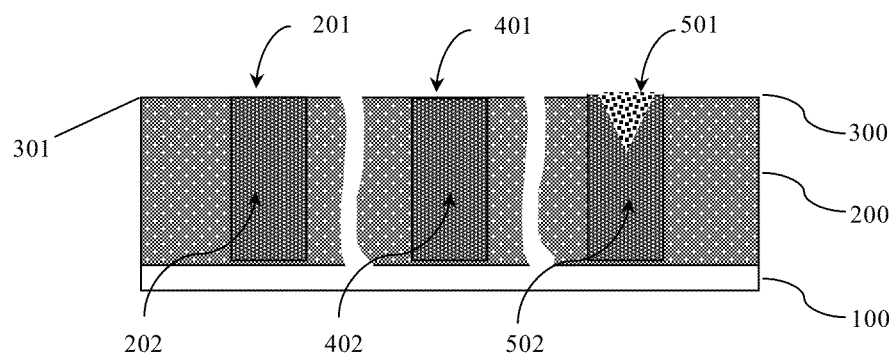

FIGS. 8D-8F illustrate another trench filling process for filling trenches in interconnected active regions and inactive regions and corresponding semiconductor structures to certain stages of the trench filling process consistent with the disclosed embodiments. FIG. 8D is similar to FIG. 8B described above. After the first trench filling process where the top surface of the P-type semiconductors inside the active region trench and the inactive region trench are at approximate same level as the top surface 301 of the trench 201 in the epitaxial layer 200, while the lowest point 5011 of the P-type semiconductor inside of the interconnection trench 501 is lower than the top surface 301 of the trench 201 in the epitaxial layer 200, a second trench filling process may use a different material to fill the trenches.

For example, the second trench filling process may use $H_2$ or $N_2$ as a carrier gas and at least one of SiH4, DCS, and TCS as a precursor to deposit polycrystalline silicon or amorphous silicon over the top surface 301, as shown in FIG. 8E. The deposition process may be performed at approximately 400-1200° C. The polycrystalline silicon or amorphous silicon is deposited over the top surface 301 with a certain thickness, until the lowest point 5012 of the top surface of the P-type semiconductor inside the interconnection trench 501 is higher than the top surface 301.

The P-type semiconductor layers 202 and 402 may be grown at the temperature of approximately 900° C. and the pressure of approximately 300 Torr, and the doping concentration is approximately $6.0E^{16}$ atoms/cm$^3$. The substrate 300 may have a crystal orientation of [100], and the crystal orientation of the trench sidewalls may also be [100]. The N-type substrate may have a doping concentration of $6.4E^{19}$ atom/cm$^3$, and the N-type epitaxial layer may have a doping concentration of $8.5E^{14}$ atom/cm$^3$.

Similarly, after the trench filling process, materials above the top surface 301 of trenches, which include the insulating layer and a portion of the P-type semiconductor, are removed by a CMP process, as shown in FIG. 8F. The final super junction structures with alternatively distributed P-Ns are ready for fabricating MOSFET devices or other devices.

Figure 16:
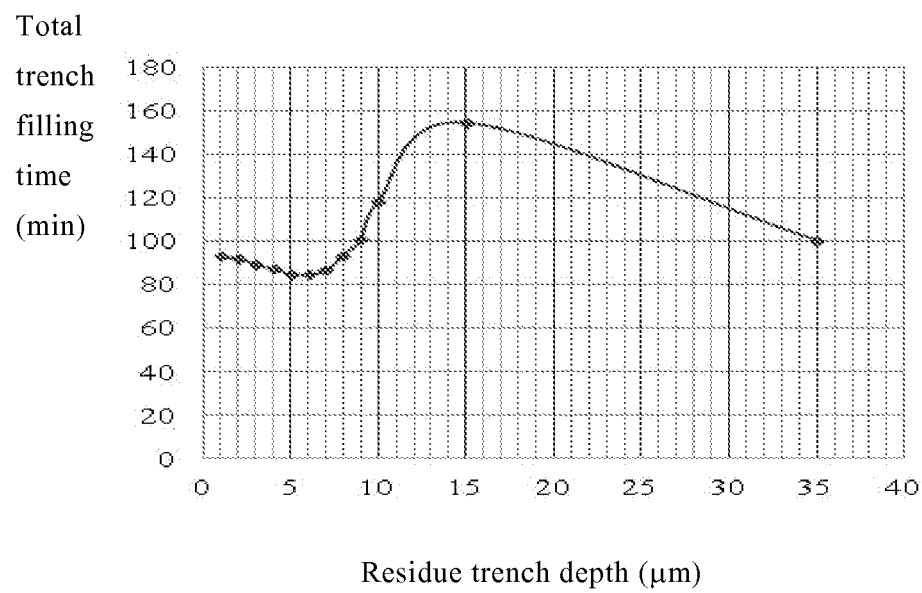
FIG. 16 illustrates a graph of relationship between the total filling time and the residue trench depth.
Figure 17:
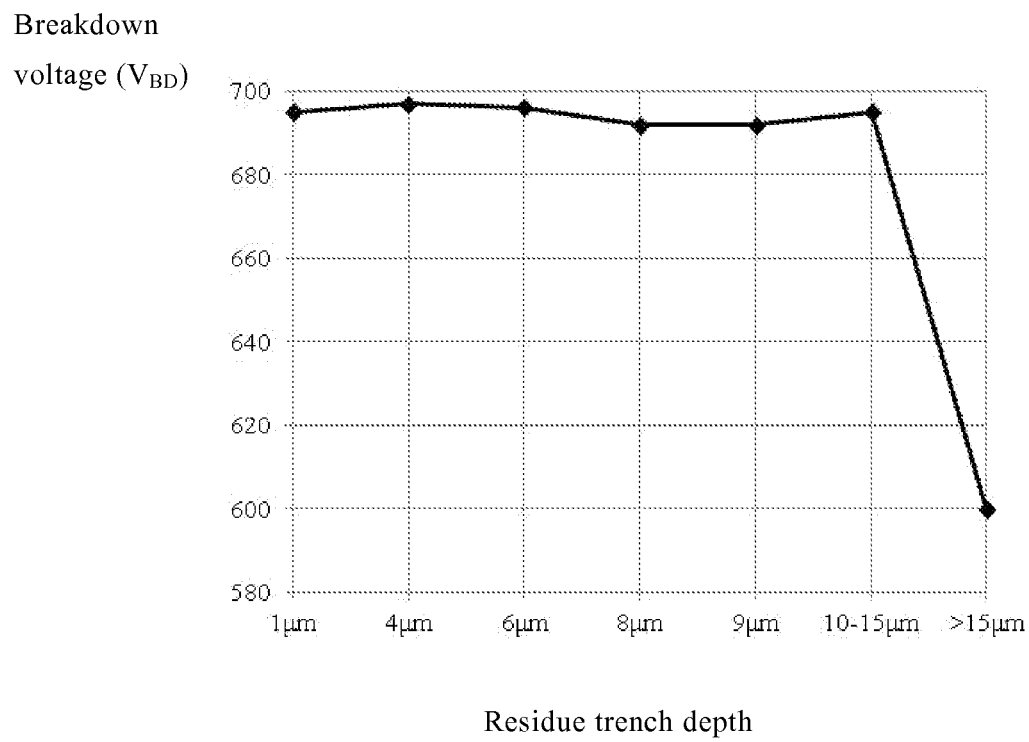
FIG. 17 illustrates a graph of relationship between the breakdown voltage and the residue trench depth.

FIG. 16 and FIG. 17 illustrate functional relationships between certain process parameters according to the various disclosed embodiments. In the various embodiments, when the first trench filling process is stopped, the distance between lowest point of the top surface of the P-type semiconductor 202 formed inside the active region and the top surface 301 of the trenches in the epitaxial layer are different (this distance is also referred as the residue trench depth). The relationship between the total trench filling time and the residue trench depth is indicated in FIG. 16, and the relationship between the breakdown voltage and the residue trench depth is indicated in FIG. 17.

As shown in FIGS. 16 and 17, when a mixture of silicon source gas and halogenoid gas is used to perform the first trench filling process, until the residue trench depth is approximately 6 um (approximately 1.2 times of the top width of the active region trench), and followed by the second or final trench filling process using only a silicon source gas without any halogenoid gas, there is no void in the formed semiconductor inside of the trench and the breakdown voltage is approximately 696V. This configuration may thus provide minimum total filling time with desired breakdown voltage value. When the residue trench depth is from 8 um to 15 um (approximately 1.6 to 3.0 times of the top width of the active region trench), although the trench filling quality is acceptable as shown in FIGS. 13 and 14 and the breakdown voltage does not decrease significantly, the total trench filling time is longer.

Figure 15:
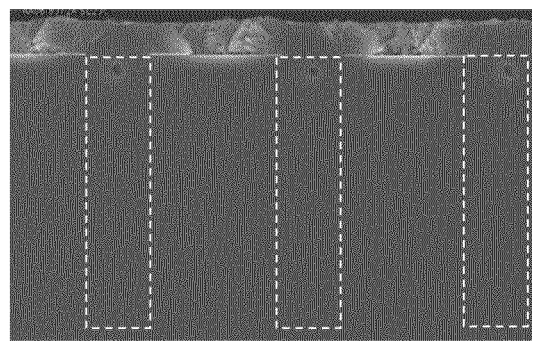
FIG. 15 is another SEM image of the cross section view of semiconductor device with filled up trenches consistent with the disclosed embodiments.

When the residue trench depth is larger than 15 um (more than 3.0 times of the top width of the active region trench), the trench filling quality is poor (as shown in FIG. 15, a void exists in the P-type semiconductor inside of the trench) and the break down voltage decreases substantially. The total trench filling time is also longer, especially with the second trench filling process. Thus, the trench filling process may be ineffective.

Figure 13:
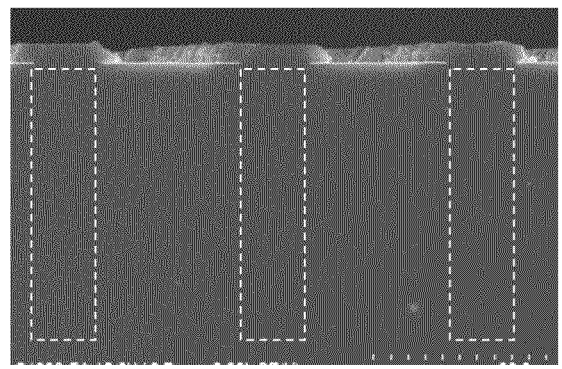
FIG. 13 is another SEM image of the cross section view of semiconductor device with filled up trenches consistent with the disclosed embodiments.
Figure 14:
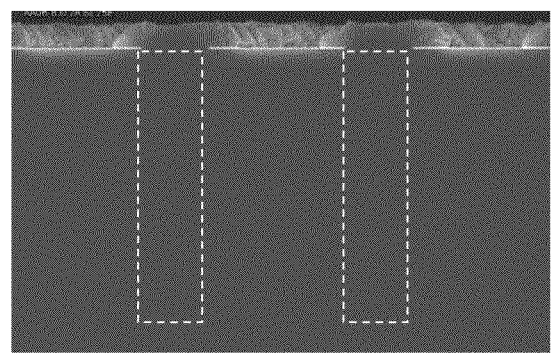
FIG. 14 is another SEM image of the cross section view of semiconductor device with filled up trenches consistent with the disclosed embodiments.

The trench filling quality may be further illustrated by the series SEM images in FIGS. 9-15. FIG. 9 illustrates a cross-section view of the filled trenches using the residue trench depth of 1.0 um; FIG. 10 illustrates a cross-section view of the filled trenches using the residue trench depth of 2.0 um; FIG. 11 illustrates a cross-section view of the filled trenches using the residue trench depth of 4.0 um; FIG. 12 illustrates a cross-section view of the filled trenches using the residue trench depth of 6.0 um; FIG. 13 illustrates a cross-section view of the filled trenches using the residue trench depth of 9.0 um; FIG. 14 illustrates a cross-section view of the filled trenches using the residue trench depth of 10.0 um; and FIG. 15 illustrates a cross-section view of the filled trenches using the residue trench depth of 15.0 um.

Thus, by using the disclosed methods and structures, various improved semiconductor fabrication processes may be implemented. A mixture of silicon source gas and halogenoid gas may be used to fill trenches at the beginning of the trench filling process, and only the silicon source gas, without any halogenoid gas, may be used to fill trenches at the final stage of the trench filling process. A desired trench filling quality can be obtained, the total trench filling time can be shortened, and the trench filling efficiency can be improved. It can thus improve the productivity of semiconductor devices, and reduce the manufacturing cost of the semiconductor devices.

It should be understood that the specification is described by exemplary embodiments, but it is not necessary that each embodiment includes an independent technical solution. Those skilled in the art can understand the specification as a whole and technical features in the various embodiments can be combined to other embodiments understandable to others persons of ordinary skill in the art.

The above detailed descriptions only illustrate certain exemplary embodiments of the present invention, and are not intended to limit the scope of the present invention. Any equivalent or modification thereof, without departing the sprint and principle of the present invention, falls within the true scope of the present invention.

What is claimed is:

1. A method for fabricating a semiconductor structure, comprising:
   providing a semiconductor substrate;
   forming an epitaxial layer on a top surface of the semiconductor substrate and having a predetermined thickness;
   forming a plurality of trenches in the epitaxial layer, the trenches being formed in the epitaxial layer and having a predetermined depth, top width, and bottom width;
   performing a first trench filling process to form a semiconductor layer inside of the trenches using a mixture gas containing at least silicon source gas and halogenoid gas;
   stopping the first trench filling process when at least one trench is not completely filled; and
   performing a second trench filling process, different from the first trench filling process and using only the silicon source gas without any halogenoid gas, to fill the plurality of trenches completely, such that the second trench filling process using only the silicon source gas provides a significantly- increased growth rate of the semiconductor layer, comparing to a growth rate of the semiconductor layer using the mixture gas in the first trench filling process.

2. The method according claim 1, wherein performing the second trench filling process further includes:
   performing the second trench filling process to fill the plurality of trenches completely using one of polycrystalline silicon and amorphous silicon.

3. The method according claim 1, wherein the first trench filling process further includes at least one of:
   decreasing a gas flow rate of the silicon source gas in gradient; and
   increasing a gas flow rate of the halogenoid gas in gradient.

4. The method according to claim 1, wherein:
the epitaxial layer on the substrate is divided into active regions and inactive regions; and
trenches in the active regions and trenches in the inactive regions have different depths, top widths, and bottom widths.

5. The method according to claim 4, wherein:
the trenches in the active regions and trenches in the inactive region are interconnected.

6. The method according to claim 1, before performing the second trench filling process, further including:
etching the semiconductor inside the trenches using only a halogenoid gas to increase the opening angle of the semiconductor inside the trenches.

7. The method according to claim 1, wherein the stopping the first trench filling process further includes:
monitoring a distance between a top surface of the semiconductor inside of the trenches and a top surface of the trenches;
when the distance is approximately 1.6 times of a width of the trenches, stopping the first trench filling process to provide the significantly-increased growth rate for the semiconductor layer and to substantially avoid voids formed in the semiconductor layer.

8. The method according to claim 1, wherein the stopping the first trench filling process further includes:
monitoring a distance between a top surface of the semiconductor inside of the trenches and a top surface of the trenches;
when the distance is approximately 1.2 times of a width of the trenches, stopping the first trench filling process.

9. The method according to claim 1, wherein:
the epitaxial layer is doped by a doping gas containing one or more of borane ($BH_3$), diborane ($B_2H_3$), and tetraborane ($B_4H_{10}$).

10. The method according to claim 1, wherein:
the silicon source gas includes one or more of silane ($SiH_4$), dichloromethylsilane ($SiH_2Cl_2$), trichlorosilane ($SiHCl_3$), and silicon tetrachloride ($SiCl_4$); and
the halogenoid gas includes one or more of chlorine ($Cl_2$), hydrogen chloride (HCl), fluorine ($F_2$), chlorine trifluoride ($ClF_3$), hydrogen fluoride (HF), and hydrogen bromide (HBr).

11. The method according to claim 1, wherein:
the top width of the trenches is equal to or greater than the bottom width of the trenches.

12. The method according to claim 1, further including:
performing a CMP process on top of the epitaxial layer to form a plurality of semiconductor junctions based on the trenches.

13. A semiconductor structure, comprising:
a semiconductor substrate having a top surface;
an epitaxial layer formed on the top surface of the semiconductor substrate and having a predetermined thickness;
a plurality of trenches formed in the epitaxial layer and having a predetermined depth, top width, and bottom width; and
a plurality of semiconductor junctions formed based on semiconductors filled in the plurality of trenches,
wherein the semiconductors are filled in the trenches by:
performing a first trench filling process to form a semiconductor layer inside of the trenches using a mixture gas containing at least silicon source gas and halogenoid gas;
stopping the first trench filling process when at least one trench is not completely filled; and
performing a second trench filling process, different from the first trench filling process and using only the silicon source gas without any halogenoid gas, to fill the plurality of trenches completely, such that the second trench filling process using only the silicon source gas provides a significantly-increased growth rate of the semiconductor layer, comparing to a growth rate of the semiconductor layer using the mixture gas in the first trench filling process.

14. The semiconductor structure according claim 13, wherein performing the second trench filling process further includes:
performing a second trench filling process to fill the plurality of trenches completely using one of polycrystalline silicon and amorphous silicon to form the semiconductors in the trenches.

15. The semiconductor structure according claim 13, wherein the first trench filling process further includes at least one of:
decreasing a gas flow rate of the silicon source gas in gradient; and
increasing a gas flow rate of the halogenoid gas in gradient.

16. The semiconductor structure according to claim 13, wherein:
the epitaxial layer on the substrate is divided into active regions and inactive regions; and
trenches in the active regions and trenches in the inactive regions have different depths and widths.

17. The semiconductor structure according to claim 16, wherein:
the trenches in the active regions and trenches in the inactive region are interconnected.

18. The semiconductor structure according to claim 13, before performing the second trench filling process, further including:
etching the semiconductor inside the trenches using only a halogenoid gas to increase the opening angle of the semiconductor inside the trenches.

19. The semiconductor structure according to claim 13, wherein the stopping the first trench filling process further includes:
monitoring a distance between a top surface of the semiconductor inside of the trenches and a top surface of the trenches;
when the distance is approximately 1.6 times of a width of the trenches, stopping the first trench filling process.

20. The semiconductor structure according to claim 13, wherein the stopping the first trench filling process further includes:
monitoring a distance between a top surface of the semiconductor inside of the trenches and a top surface of the trenches;
when the distance is approximately 1.2 times of a width of the trenches, stopping the first trench filling process.

21. The semiconductor structure according to claim 13, wherein:
the epitaxial layer is doped by a doping gas containing one or more of borane ($BH_3$), diborane ($B_2H_3$), and tetraborane ($B_4H_{10}$);
the silicon source gas includes one or more of silane ($SiH_4$), dichloromethylsilane ($SiH_2Cl_2$), trichlorosilane ($SiHCl_3$), and silicon tetrachloride ($SiCl_4$); and
the halogenoid gas includes one or more of chlorine ($Cl_2$), hydrogen chloride (HCl), fluorine ($F_2$), chlorine trifluoride ($ClF_3$), hydrogen fluoride (HF), and hydrogen bromide (HBr).

22. The semiconductor structure according to claim 13, wherein:
  top width of the trenches is equal to or greater than bottom width of the trenches.

23. The method according to claim 1, further including:
  between the first trench filling process and the second trench filling process, etching a top surface of the semiconductor layer formed inside of the trenches,
  wherein the etching includes a process selected from a plasma etching (PE), a reactive ion etching (RIE), or an ion beam etching (IBE).

24. The method according to claim 1, wherein the epitaxial layer on the substrate is divided into active regions and inactive regions and the plurality of trenches includes active region trenches and inactive region trenches, the method further including:
  performing the first trench filling process on the active region trenches and the inactive region trenches;
  stopping the first trench filling process when the active region trenches are completely filled while the inactive region trenches are not completely filled; and
  performing the second trench filling process to fill the plurality of trenches completely.

\* \* \* \* \*